(12) United States Patent
Kim et al.

(10) Patent No.: US 11,538,812 B2
(45) Date of Patent: Dec. 27, 2022

(54) SEMICONDUCTOR DEVICE WITH AIR GAP AND METHOD FOR FABRICATING THE SAME

(71) Applicant: SK hynix Inc., Gyeonggi-do (KR)

(72) Inventors: Chan-Bae Kim, Seoul (KR); Sang-Soo Park, Gyeonggi-do (KR); Tae-Hyeok Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 191 days.

(21) Appl. No.: 17/122,427

(22) Filed: Dec. 15, 2020

(65) Prior Publication Data

US 2021/0134808 A1   May 6, 2021

Related U.S. Application Data

(63) Continuation of application No. 16/231,899, filed on Dec. 24, 2018, now Pat. No. 10,930,655.

(30) Foreign Application Priority Data

Jul. 13, 2018 (KR) .................. 10-2018-0081930

(51) Int. Cl.
 H01L 27/108 (2006.01)
 H01L 21/768 (2006.01)

(52) U.S. Cl.
 CPC .... H01L 27/10885 (2013.01); H01L 21/7682 (2013.01); H01L 21/76843 (2013.01); H01L 27/10823 (2013.01); H01L 27/10855 (2013.01); H01L 27/10888 (2013.01); H01L 27/10891 (2013.01)

(58) Field of Classification Search
 CPC .................................................. H01L 21/7682
 See application file for complete search history.

(56) References Cited

U.S. PATENT DOCUMENTS 9,425,200 B2 * 8/2016 Hwang ............... H01L 23/5226

* cited by examiner

Primary Examiner — Yu-Hsi D Sun
(74) Attorney, Agent, or Firm — IP & T Group LLP

(57) ABSTRACT

A method for fabricating a semiconductor device includes: forming a first conductive structure over a substrate; forming a multi-layer spacer including a non-conformal sacrificial spacer on both sidewalls of the first conductive structure; forming a second conductive structure adjacent to the first conductive structure with the multi-layer spacer therebetween; forming an air gap by removing the non-conformal sacrificial spacer; forming a capping layer covering the second conductive structure and the air gap; forming an opening that exposes a top surface of the second conductive structure by etching the capping layer; and forming a conductive pad coupled to the second conductive structure in the opening.

10 Claims, 30 Drawing Sheets

SEMICONDUCTOR DEVICE WITH AIR GAP AND METHOD FOR FABRICATING THE SAME

CROSS-REFERENCE TO RELATED APPLICATIONS

This application is a continuation of U.S. patent application Ser. No. 16/231,899 filed on Dec. 24, 2018, which claims benefits of priority of Korean Patent Application No. 10-2018-0081930 filed on Jul. 13, 2018. The disclosure of each of the foregoing application is incorporated herein by reference in its entirety.

BACKGROUND

1. Field

Exemplary embodiments of the present invention relate generally to a semiconductor device and, more particularly, to a semiconductor device with one or more air gaps and a method for fabricating the semiconductor device.

2. Description of the Related Art

Typically, a semiconductor device may have a dielectric material formed between neighboring conductive structures. As semiconductor devices become more highly integrated, the distance between the conductive structures is gradually getting smaller, which may increase a phenomenon known as parasitic capacitance. It is also known that higher levels of parasitic capacitance may negatively impact performance of a semiconductor device.

Therefore, it would be highly desirable to reduce the parasitic capacitance in highly integrated semiconductor devices. One possible way for reducing the parasitic capacitance of highly integrated semiconductor devices would be to select dielectric materials with lower dielectric constant. However, because of other reasons the dielectric materials used in the making of highly integrated semiconductor devices have relatively high dielectric constants, therefore, there exists a limitation in reducing the parasitic capacitance.

SUMMARY

Various embodiments of the present invention are directed to a semiconductor device and a method of fabricating the same that can reduce the parasitic capacitance between neighboring conductive structures in highly integrated semiconductor devices, regardless of the dielectric material employed for isolating neighboring conductive structures.

In accordance with an embodiment of the present invention, a method for fabricating a semiconductor device includes: forming a first conductive structure over a substrate; forming a multi-layer spacer including a non-conformal sacrificial spacer on both sidewalls of the first conductive structure; forming a second conductive structure adjacent to the first conductive structure with the multi-layer spacer therebetween; forming an air gap by removing the non-conformal sacrificial spacer; forming a capping layer covering the second conductive structure and the air gap; forming an opening that exposes a top surface of the second conductive structure by etching the capping layer; and forming a conductive pad coupled to the second conductive structure in the opening.

In accordance with another embodiment of the present invention, a semiconductor device includes: a plurality of bit line structures that are formed to be spaced apart from each other over a semiconductor substrate; a bit line spacer that is formed on both sidewalls of each of the bit line structures; a plurality of storage node contact plugs that are formed between the bit line structures and contact the semiconductor substrate; a pair of line-shaped air gaps that is formed between the bit line structures and the storage node contact plugs and parallel to both sidewalls of the bit line structure; a capping layer that caps the line-shaped air gaps and includes an opening that opens the top surfaces of the storage node contact plugs; and a conductive pad that is formed in the opening of the capping layer and coupled to the storage node contact plugs, wherein the pair of the line air gaps includes a lower air gap that is adjacent a sidewall of a lower portion of each of the bit line structures and an upper air gap that is adjacent to a sidewall of an upper portion of each of the bit line structures, and the upper air gap has a narrower width than the lower air gap.

The semiconductor device may further include a first spacer and a second spacer that are in parallel to the sidewalls of the bit line structures with the line-shaped air gaps therebetween. The pair of the line-shaped air gaps has a symmetric shape on both sidewalls of each of the bit line structures. Each of the bit line structures may include a bit line contact plug over the semiconductor substrate; a bit line over the bit line contact plug; and a bit line hard mask over the bit line, wherein the lower air gap is positioned on both sidewalls of the bit line, and the upper air gap is positioned on both sidewalls of the bit line hard mask.

The semiconductor device may further include a contact hole in which the bit line contact plug is formed; and a dielectric plug that fills the contact hole on both sidewalls of the bit line contact plug. The storage node contact plug may include a lower plug; an ohmic contact layer over the lower plug; and an upper plug over the ohmic contact layer, a top surface of the upper plug is positioned at the same level as a top surface of the bit line structure. The capping layer may further include an extension portion suitable for filling an upper portion of each of the line-shaped air gaps. The extension portion of the capping layer has a shape parallel to the sidewalls of the bit line structure.

These and other features and advantages of the present invention will become more apparent to those skilled in the art of the present invention from the following detailed description with reference to the accompanying drawings.

DETAILED DESCRIPTION

Figure 1:
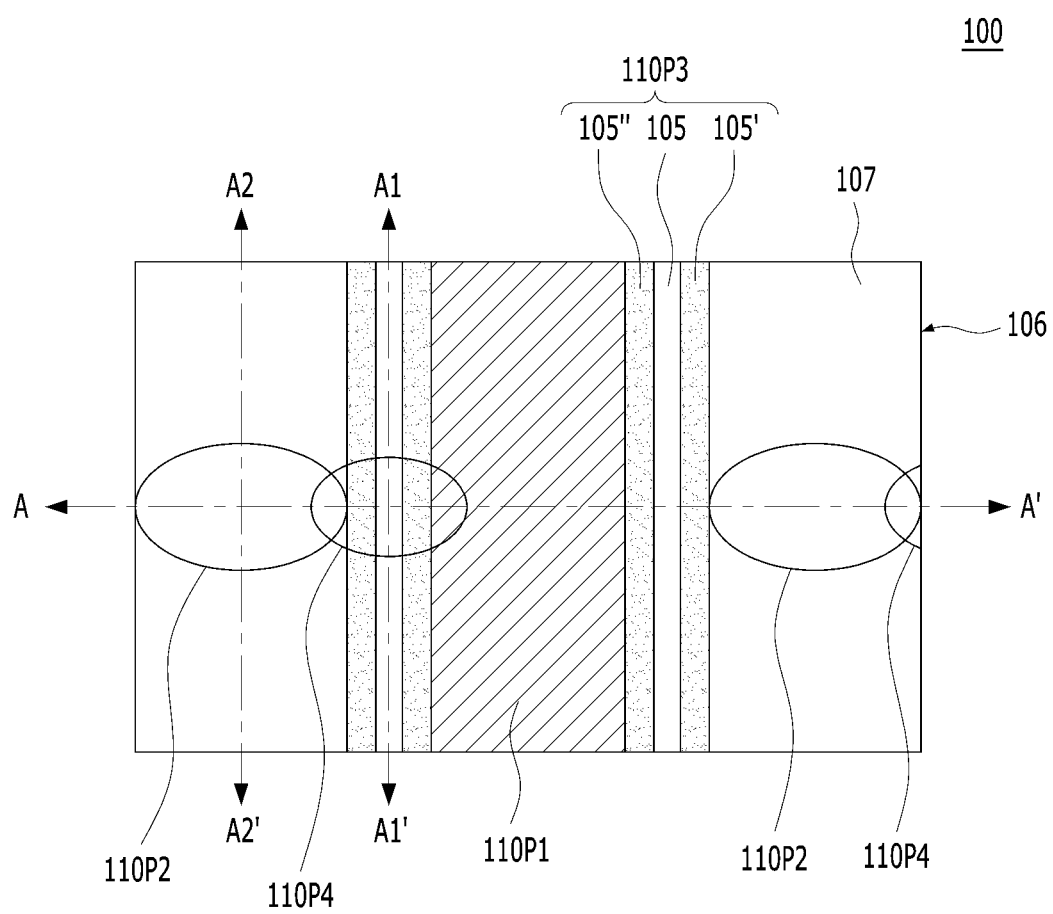
FIG. 1 is a plan view illustrating a semiconductor device 100 in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 2A:
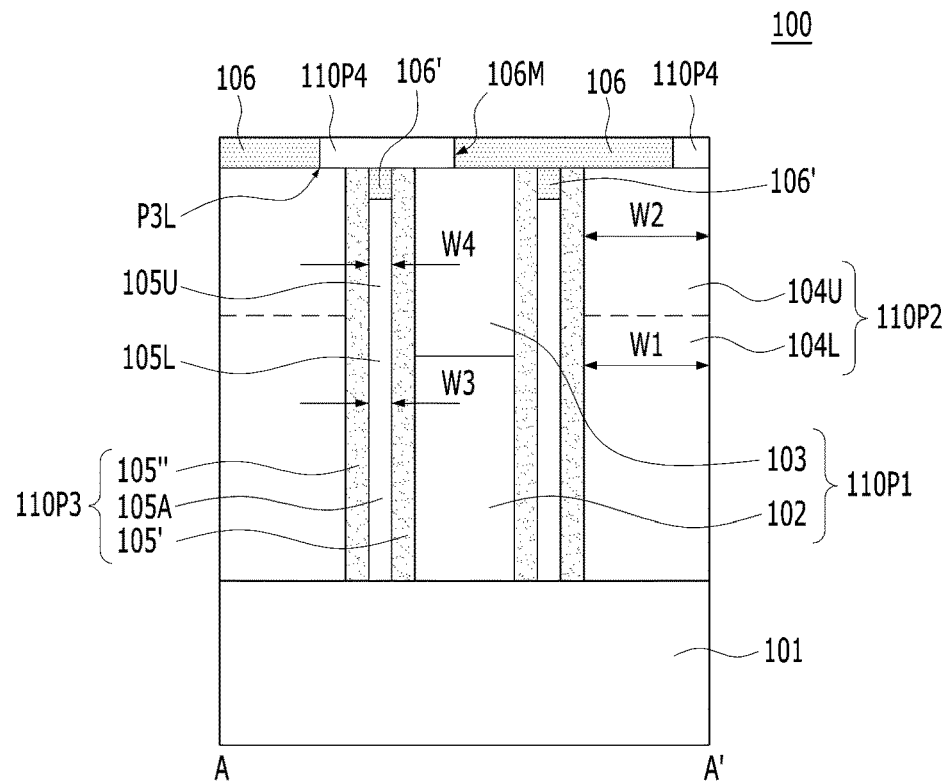
FIG. 2A is a cross-sectional view of the semiconductor device 100 taken along a line A-A' of FIG. 1.
Figure 2B:
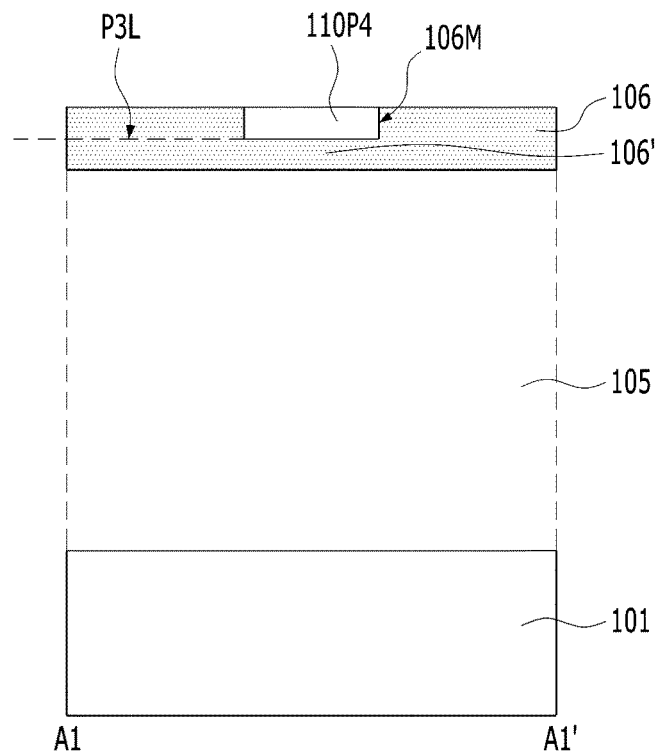
FIG. 2B is a cross-sectional view of the semiconductor device 100 taken along a line A1-A1' of FIG. 1.
Figure 2C:
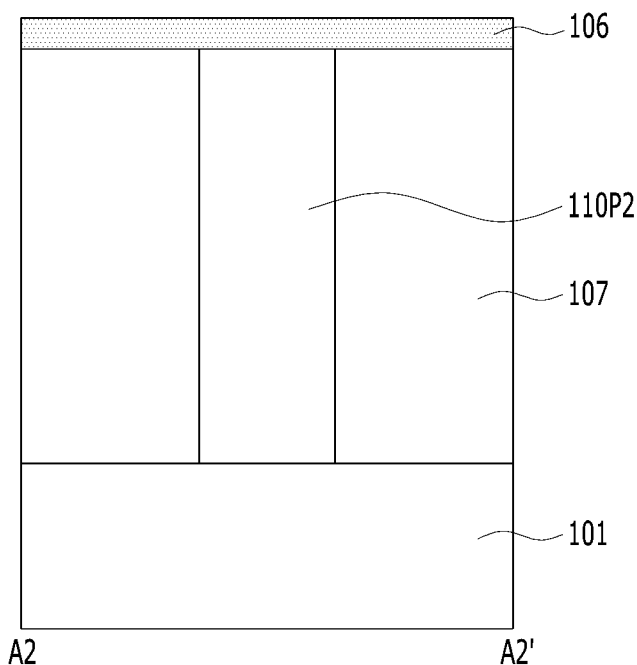
FIG. 2C is a cross-sectional view of the semiconductor device 100 taken along a line A2-A2' of FIG. 1.

FIG. 1 is a plan view illustrating a semiconductor device 100 in accordance with an embodiment of the present invention. FIG. 2A is a cross-sectional view of the semiconductor device 100 taken along a line A-A' of FIG. 1. FIG. 2B is a cross-sectional view of the semiconductor device 100 taken along a line A1-A1' of FIG. 1. FIG. 2C is a cross-sectional view of the semiconductor device 100 taken along a line A2-A2' of FIG. 1.

Referring to FIGS. 1 to 2C, the semiconductor device 100 may include a first pattern structure 110P1 and a second pattern structure 110P2 that are formed over a substrate 101. The semiconductor device 100 may further include a third pattern structure 110P3 between the first pattern structure 110P1 and the second pattern structure 110P2. The semiconductor device 100 may further include a fourth pattern structure 110P4 formed over the second pattern structure 110P2. The semiconductor device 100 may further include a capping layer 106 between the neighboring fourth pattern structures 110P4.

The first pattern structure 110P1 may include a first conductive pattern 102 formed over the substrate 101. The first pattern structure 110P1 may further include a hard mask pattern 103 formed over the first conductive pattern 102. The first conductive pattern 102 may be in direct contact with the substrate 101 as illustrated in the embodiment of FIG. 2A. However, in a variation of the embodiment (not illustrated) the first conductive pattern 102 and the substrate 101 may be electrically isolated by an isolation material or a dielectric material layer formed therebetween. The first conductive pattern 102 may be formed of or include polysilicon, a metal, a metal nitride, a metal silicide, or a combination thereof. The hard mask pattern 103 may be formed of or include a dielectric material. When viewed from the top, the first pattern structure 110P1 may have a shape of a line, i.e., an elongated, straight linear shape that extends in one direction, referred to hereinafter as a second direction Y. The second direction Y may be vertical to a first direction X. First direction X may be referred to also as a horizontal direction.

The second pattern structure 110P2 may be horizontally adjacent to the third pattern structure 110P3 and the first pattern structure 110P1. The second pattern structure 110P2 may include a lower region 104L and an upper region 104U. The lower region 104L and the upper region 104U may be made of the same material. The lower region 104L and the upper region 104U may have the same width (W1=W2) which is measured horizontally, i.e., along the first direction X. The second pattern structure 110P2 may be positioned in an island-shape on both sides of the first pattern structure 110P1. The second pattern structure 110P2 may be positioned in a pattern isolation layer 107. The pattern isolation layer 107 may contact the third pattern structure 110P3. The pattern isolation layer 107 may be formed or include a dielectric material. When viewed from the top the second pattern structure 110P2 may have an oval, island shape on both sides of the first pattern structure 110P1.

The third pattern structure 110P3 may include multiple layers of a dielectric material. The third pattern structure 110P3 may include a first dielectric material 105' which is positioned on both sidewalls of the first conductive pattern 102. The third pattern structure 110P3 may further include a second dielectric material 105" which is in parallel to the first dielectric material 105' and is separated from the first dielectric material 105' by an air gap 105. The second dielectric material 105" may contact a sidewall of the second pattern structure 110P2. The first dielectric material 105' may be in direct contact with the first pattern structure 110P1. The second dielectric material 105" may be in direct contact with the sidewalls of the second pattern structure 110P2.

The third patterned structure 110P3 may further include the air gap 105 which is formed between the first dielectric material 105' and the second dielectric material 105". The air gap 105 may be in parallel to the first and second dielectric materials 105' and 105". Referring to FIG. 2A, the top surface of the air gap 105 may be positioned at a lower level than the top surfaces of the first and second dielectric materials 105' and 105". The first dielectric material 105' and the second dielectric material 105" may be of the same thickness. The thickness of the air gap 105 may be the same as the thicknesses of the first and second dielectric materials 105' and 105". The air gap 105 may include a lower air gap 105L which is adjacent to the first conductive pattern 102 and an upper air gap 105U which is adjacent to the hard mask pattern 103. The lower air gap 105L and the upper air gap 105U may have the same width (W3=W4). The air gap 105 may have an elongated, straight linear shape which is in parallel to both sidewalls of the first pattern structure 110P1. The widths of the lower air gap 105L and the upper air gap 105U may be approximately 10 Å or less.

The third pattern structure 110P3 may be referred to as a spacer structure. Accordingly, the third pattern structure 110P3 may include multiple layers of spacers. For example, the first dielectric material 105' may be referred to as a first spacer, and the second dielectric material 105" may be referred to as a second spacer. The air gap 105 may be defined between the first spacer and the second spacer.

The fourth pattern structure 110P4 may include a conductive material. The fourth pattern structure 110P4 may contact the top surface of the second pattern structure 110P2. The second pattern structure 110P2 and the fourth pattern structure 110P4 may be electrically connected. The fourth pattern structure 110P4 and the second pattern structure 110P2 may partially overlap with each other. A portion of the fourth pattern structure 110P4 may partially overlap with the hard mask pattern 103 of the first pattern structure 110P1.

A capping layer 106 may be formed between the neighboring fourth pattern structures 110P4. The capping layer 106 may cover the top surfaces of the second pattern structure 110P2, the first pattern structure 110P1, and the pattern isolation layer 107. The capping layer 106 may be formed or include a dielectric material. The capping layer 106 may include a capping extension portion 106' that extends into the inside of the upper air gap 105U. The capping extension portion 106' may fill the upper portion of the upper air gap 105U. The upper air gap 105U may be obstructed by the capping extension 106' from contacting the fourth pattern structure 110P4. As described below, after an opening 106M is formed in the capping layer 106, the opening 106M may be filled with the fourth pattern structure 110P4. The bottom surface of the opening 106M may be positioned at the same level as the top surface P3L of the second pattern structure 110P2. The bottom surface of the capping extension portion 106' may be positioned at a lower level than the top surface of the second pattern structure 110P2. The top surface P3L of the second pattern structure 110P2 and the top surface of the first pattern structure 110P1 may be positioned at the same level.

According to the above description, the air gap 105 may be formed between the first pattern structure 110P1 and the second pattern structure 110P2. The air gap 105 may be in parallel to both sidewalls of the first pattern structure 110P1. The air gap 105 may have an elongated, straight linear shape or simply stated the shape of a line.

The air gap 105 may reduce the parasitic capacitance between the first pattern structure 110P1 and the second pattern structure 110P2.

In the third pattern structure 110P3, the first dielectric materials 105' and the second dielectric materials 105" may be formed of or include a low k material. The first dielectric materials 105' and the second dielectric materials 105" may have a dielectric constant of approximately 7.5 or less. The first dielectric material 105' may be formed of or comprise a silicon nitride. The first dielectric material 105' may further include an impurity. The impurity may be selected to decrease the dielectric constant of the first dielectric material 105'. For example, suitable impurities for the first dielectric material 105' may include carbon, boron, or a combination thereof. The first dielectric material 105' may be formed of or include a silicon nitride or a doped silicon nitride. The first dielectric material 105' may include $Si_3N_4$, SiCN, SiOCN, SiBN or SiBCN. The second dielectric material 105" may be the same as the first dielectric material 105'.

The third pattern structure 110P3 may include a nitride-air-nitride (NAN) structure. The NAN structure may be formed by a stack of the first dielectric material 105'/the air gap 105/the second dielectric material 105". An example of the NAN structure may include a stack of a silicon nitride/an air gap/a silicon nitride.

Figure 3:
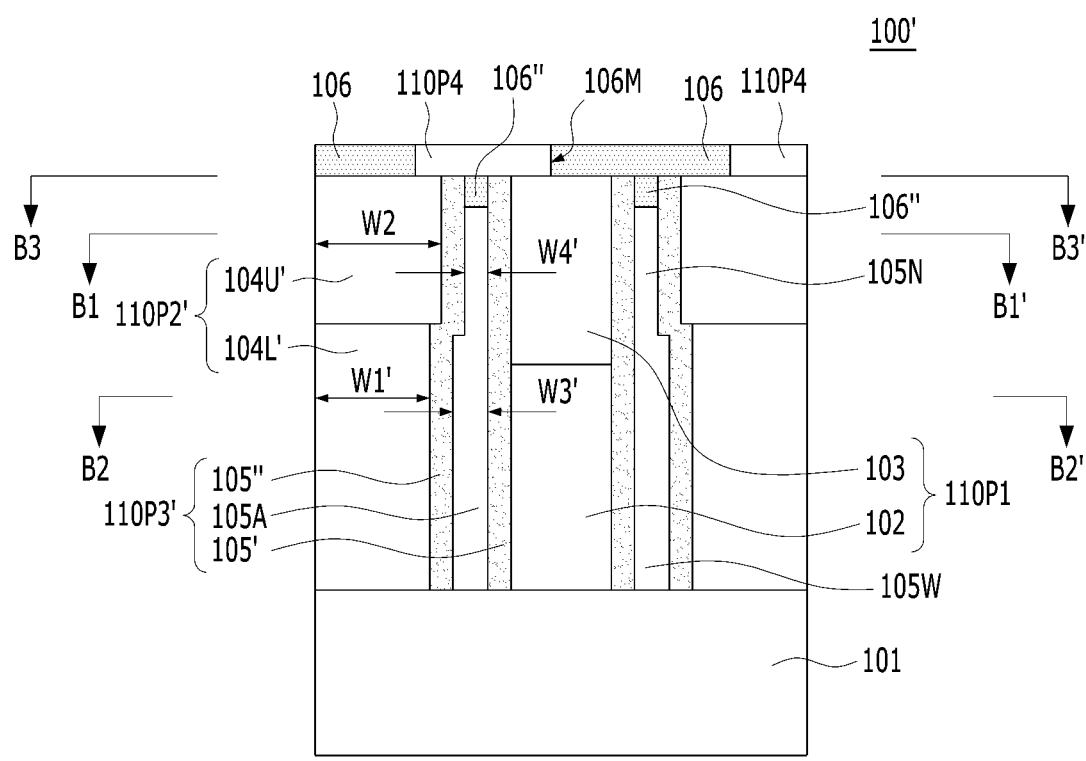
FIG. 3 is a cross-sectional view illustrating a semiconductor device 100' in accordance with another embodiment of the present invention.
Figure 4A:
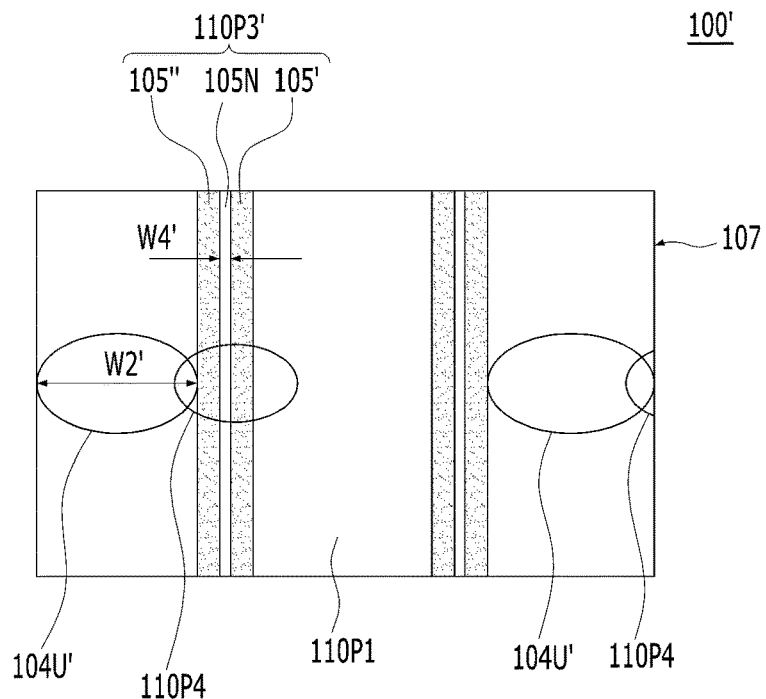
FIG. 4A is a cross-sectional view of the semiconductor device 100' taken along a line B1-B1' of FIG. 3.
Figure 4B:
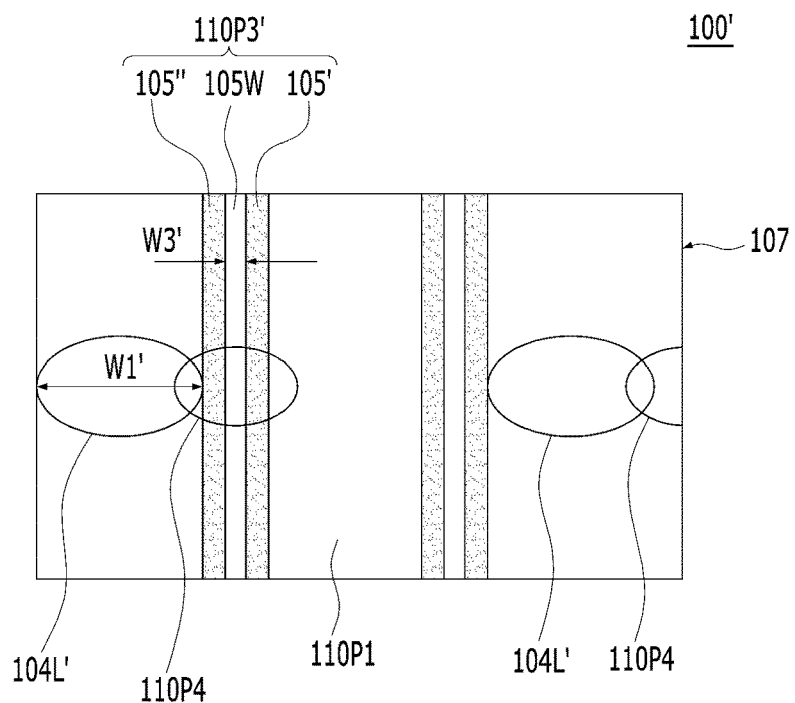
FIG. 4B is a cross-sectional view of the semiconductor device 100' taken along a line B2-B2' of FIG. 3.
Figure 4C:
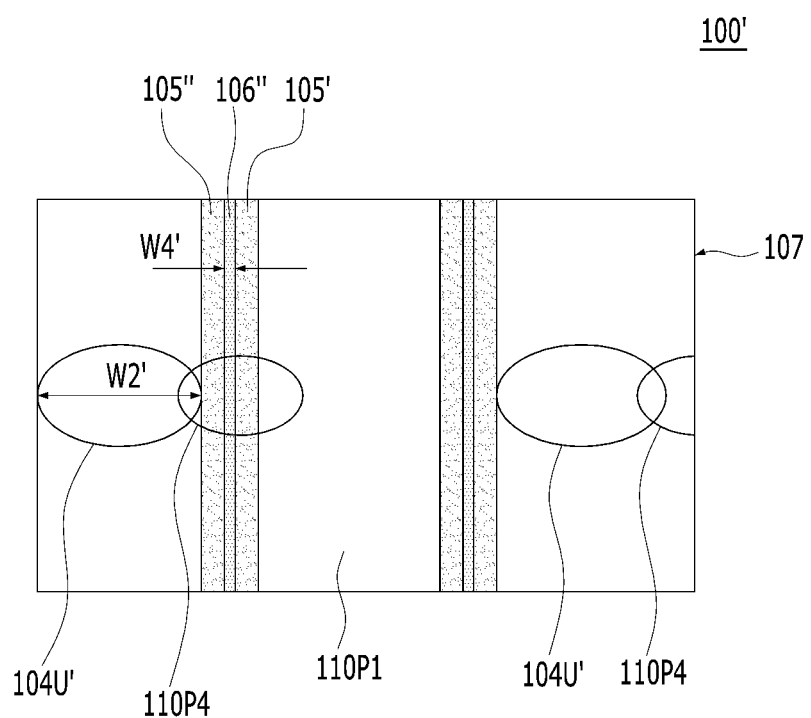
FIG. 4C is a cross-sectional view of the semiconductor device 100' taken along a line B3-B3' of FIG. 3.

FIG. 3 is a cross-sectional view illustrating a semiconductor device 100' in accordance with another embodiment of the present invention. The semiconductor device 100' may be similar to the semiconductor device 100 of FIG. 1. FIG. 4A is a cross-sectional view of the semiconductor device 100' taken along a line B1-B1' of FIG. 3. FIG. 4B is a cross-sectional view of the semiconductor device 100' taken along a line B2-B2' of FIG. 3. FIG. 4C is a cross-sectional view of the semiconductor device 100' taken along a line B3-B2' of FIG. 3.

Referring to FIGS. 3 to 4C, the semiconductor device 100' may include a first pattern structure 110P1 and a second pattern structure 110P2' that are formed over a substrate 101. The semiconductor device 100' may further include a third pattern structure 110P3' formed between the first pattern structure 110P1 and the second pattern structure 110P2'. The semiconductor device 100' may further include a fourth pattern structure 110P4 which is formed partially over the second pattern structure 110P2', over the third pattern structure 110P3' and partially over the first pattern structure 110P1. The semiconductor device 100' may further include a capping layer 106 formed between the neighboring fourth pattern structures 110P4.

The first pattern structure 110P1 may include a first conductive pattern 102 which is formed over the substrate 101. The first pattern structure 110P1 may further include a hard mask pattern 103 over the first conductive pattern 102. The first conductive pattern 102 may be in direct contact with the substrate 101. Although not illustrated, the first conductive pattern 102 and the substrate 101 may be electrically disconnected by an isolation material or a dielectric material layer. The first conductive pattern 102 may be formed of or include polysilicon, a metal, a metal nitride, a metal silicide, or a combination thereof. The hard mask pattern 103 may be formed or include a dielectric material. The first pattern structure 110P1 may have an elongated, straight linear shape that extends in one direction.

The second pattern structure 110P2' may be horizontally adjacent to the first pattern structure 110P1 but separated from the first pattern structure 110P1 by the third pattern structure 110P3' which is disposed therebetween. The second pattern structure 110P2' may include a lower region 104L' and an upper region 104U'. The lower region 104L' and the upper region 104U' may be of the same material. The upper region 104U' may have a width which is wider than a width of the lower region 104L' (W1'<W2'). The second pattern structure 110P2' may be positioned in an island shape on both sides of the first pattern structure 110P1. The second pattern structure 110P2' may be positioned in the pattern isolation layer 107. The pattern isolation layer 107 may contact the third pattern structure 110P3'. The pattern isolation layer 107 may be formed or include a dielectric material.

The third pattern structure 110P3' may include multiple layers of a dielectric material. The third pattern structure 110P3' may include a first dielectric material 105' positioned on both sidewalls of the first conductive pattern 102. The third pattern structure 110P3' may further include a second dielectric material 105" which is in parallel to the first dielectric material 105'. The second dielectric material 105" may contact a sidewall of the second pattern structure 110P2'.

The third patterned structure 110P3' may further include an air gap 105A between the first dielectric materials 105' and the second dielectric materials 105". The air gap 105A may be in parallel to the first dielectric materials 105' and the second dielectric materials 105". The top surface of the air gap 105A may be positioned at a lower level than the top surface of the first and second dielectric materials 105' and 105". The first dielectric materials 105' and the second dielectric materials 105" may have the same thickness. The air gap 105A may include an upper air gap 105N and a lower air gap 105W. The upper air gap 105N may have a width which is narrower than a width of the lower air gap 105W (W3'>W4'). The upper air gap 105N may be referred to as a 'narrow air gap', and the lower air gap 105W may be referred to as a 'wide air gap'. The width of the upper air gap 105N may be approximately 10 Å or less. The lower air gap 105W may have the same thickness as those of the first and second dielectric materials 105' and 105". The air gap 105A may have a shape of a line which is in parallel to both sidewalls of the first pattern structure 110P1.

The third pattern structure 110P3' may be referred to as a spacer structure. Accordingly, the third pattern structure 110P3' may include multiple layers of spacers. For example, the first dielectric material 105' may be referred to as a first spacer, and the second dielectric material 105" may be referred to as a second spacer. The air gap 105A may be referred to as an air gap spacer between the first spacer and the second spacer.

The fourth pattern structure 110P4 may be of a conductive material. The fourth pattern structure 110P4 may contact the top surface of the second pattern structure 110P2'. The second pattern structure 110P2' and the fourth pattern structure 110P4 may be electrically connected. The fourth pattern structure 110P4 and the second pattern structure 110P2' may partially overlap. A portion of the fourth pattern structure 110P4 may partially overlap with the hard mask pattern 103.

The capping layer 106 may be formed between the neighboring fourth pattern structures 110P4. The capping layer 106 may cover the top surfaces of the second pattern structure 110P2', the first pattern structure 110P1, and the pattern isolation layer 107. The capping layer 106 may be formed or include a dielectric material. The capping layer 106 may include a capping extension portion 106" that extends into the inside of the upper air gap 105N. The capping extension portion 106" may fill the upper portion of the upper air gap 105N. The capping extension portion 106" may obstruct the upper air gap 105N from contacting the fourth pattern structure 110P4. As described below, after the opening 106M is formed in the capping layer 106, the opening 106M may be filled with the fourth pattern structure 110P4. The bottom surface of the opening 106M may be positioned at the same level as the top surface of the second pattern structure 110P2'. The bottom surface of the capping extension portion 106" may be positioned lower than the top surface of the second pattern structure 110P2'. The top surface of the second pattern structure 110P2' and the top surface of the first pattern structure 110P1 may be positioned at the same level. From the perspective of a plan view, the capping extension portion 106" may have a shape of a line that extends in parallel to the sidewall of the upper portion of the first spacer 105".

According to the above description, an air gap 105A may be formed between the first pattern structure 110P1 and the second pattern structure 110P2'. The air gap 105A may be in parallel to both sidewalls of the first pattern structure 110P1. The air gap 105A may have a shape of a line.

The air gap 105A may reduce the parasitic capacitance between the first pattern structure 110P1 and the second pattern structure 110P2'.

In the third pattern structure 110P3', the first dielectric materials 105' and the second dielectric materials 105" may be formed of or include a low-k material. The first dielectric materials 105' and the second dielectric materials 105" may have a dielectric constant of approximately 7.5 or less. The first and second dielectric materials 105' and 105" may be formed of or include a silicon nitride. For example, suitable materials for the first and second dielectric materials 105' and 105" may include $Si_3N_4$, SiCN, SiOCN, SiBN or SiBCN.

In FIGS. 1 to 4C, the semiconductor devices 100 and 100' may be part of a memory cell.

The first conductive pattern 102 of the first pattern structure 110P1 may be a first contact plug. The second conductive pattern 110P2 and 110P2' may be a second contact plug. Accordingly, the third pattern structures 110P3 and 110P3' may reduce the parasitic capacitance between the first contact plug and the second contact plug.

The first conductive pattern 102 of the first pattern structure 110P1 may be a bit line or a bit line contact plug/bit line stack. The second pattern structure 110P2 and 110P2' may be a storage node contact plug. The third pattern structures 110P3 and 110P3' may be bit line spacers. Thus, the third pattern structures 110P3 and 110P3' may reduce the parasitic capacitance between the bit line and the storage node contact plug. Also, the parasitic capacitance between the bit line contact plug and the storage node contact plug may be reduced.

According to another embodiment of the present invention, the first conductive pattern 102 may be a gate electrode of a transistor. The second pattern structure 110P2 and 110P2' may be a contact plug that is coupled to a source/drain region of the transistor. The third pattern structures 110P3 and 110P3' may be gate spacers or contact spacers. Therefore, the third pattern structures 110P3 and 110P3' may reduce the parasitic capacitance between the gate electrode and the contact plug.

According to another embodiment of the present invention, the first pattern structure 110P1 and the second pattern structures 110P2 and 110P2' may be neighboring metal lines. Accordingly, the third pattern structures 110P3 and 110P3' may reduce the parasitic capacitance between the neighboring metal lines.

Figure 5:
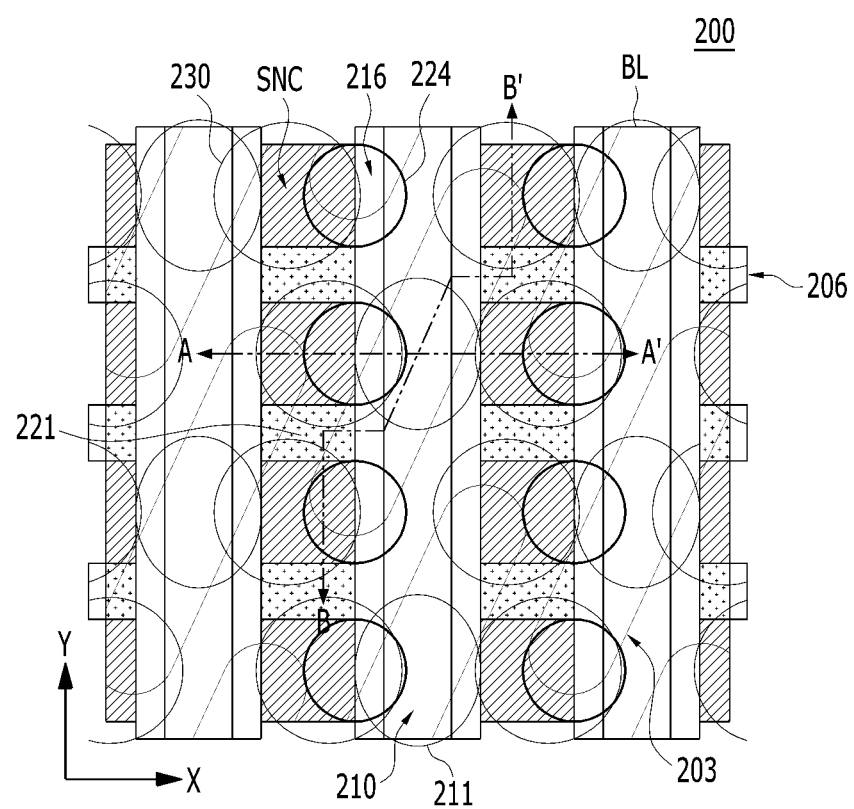
FIG. 5 is a plan view illustrating a memory cell 200 in accordance with an embodiment of the present invention.
Figure 6A:
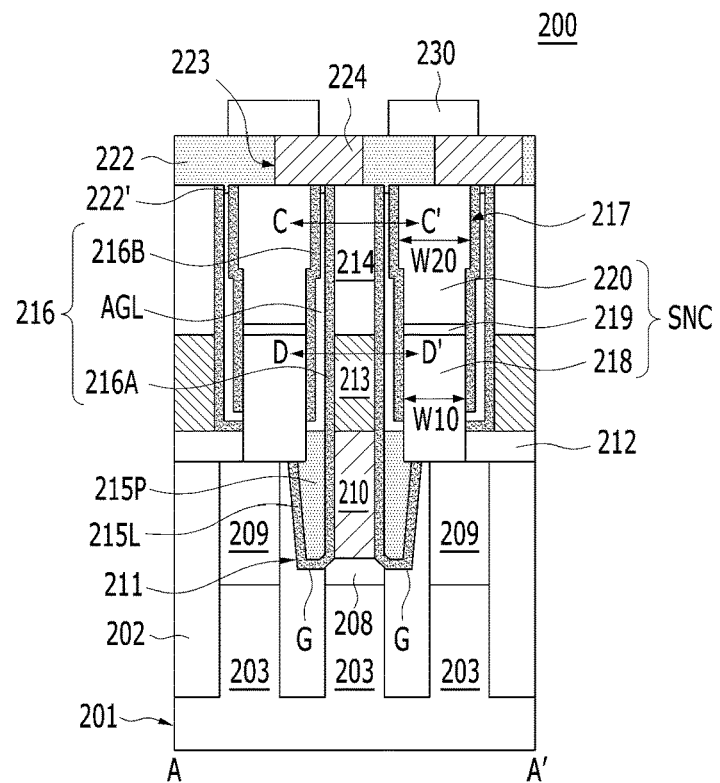
FIG. 6A is a cross-sectional view of the memory cell 200 taken along a line A-A' of FIG. 5.
Figure 6B:
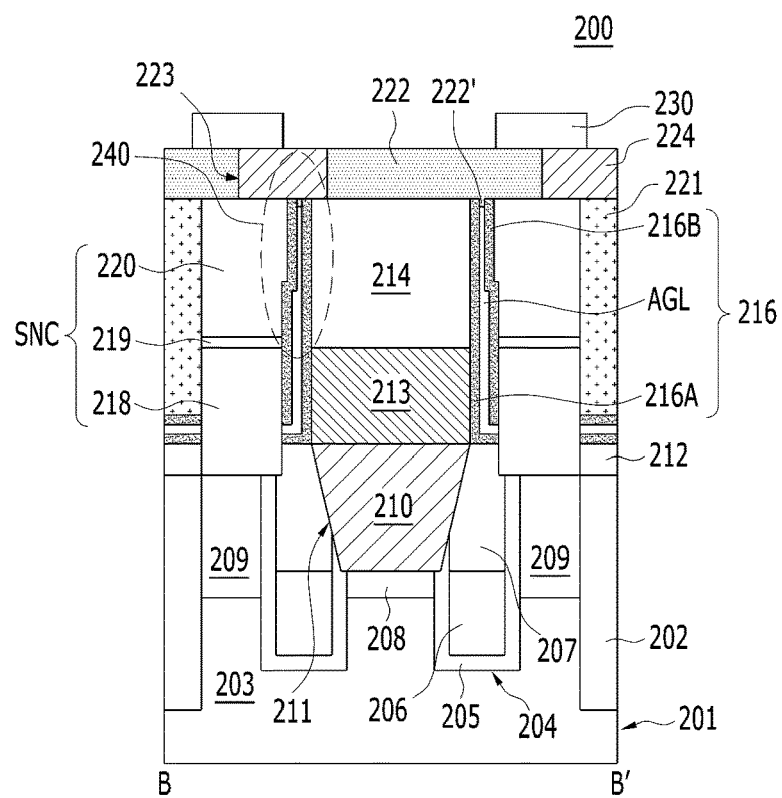
FIG. 6B is a cross-sectional view of the memory cell 200 taken along a line B-B' of FIG. 5.
Figure 6C:
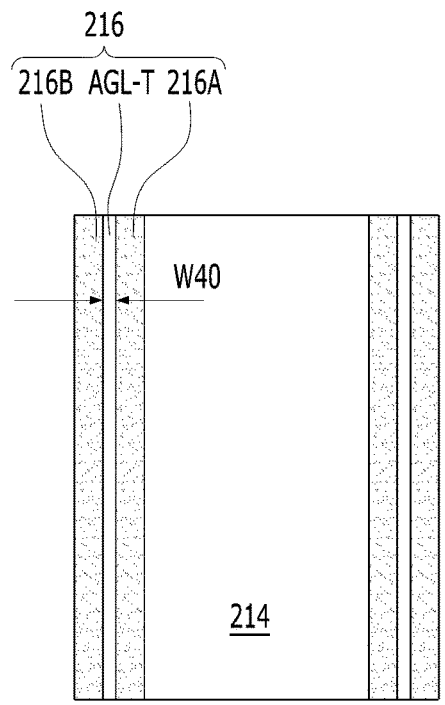
FIG. 6C is a plan view of the memory cell 200 taken along a line C-C' of FIG. 6A.
Figure 6D:
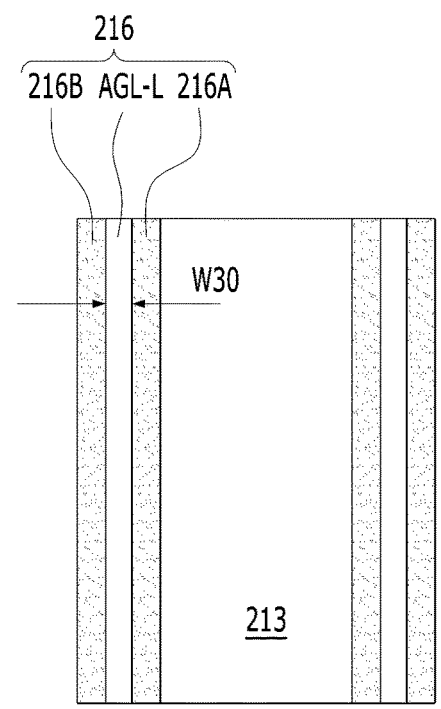
FIG. 6D is a plan view of the memory cell 200 taken along a line D-D' of FIG. 6A.
Figure 6E:
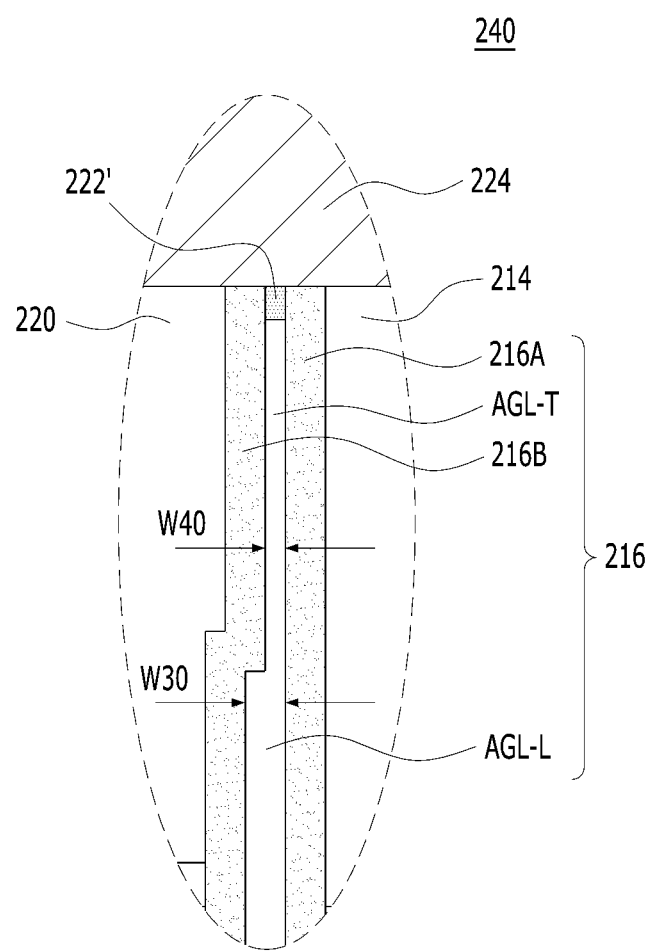
FIG. 6E illustrates an enlarged view illustrating a line-type air gap AGL.

FIG. 5 is a plan view illustrating a memory cell 200 in accordance with an embodiment of the present invention. FIG. 6A is a cross-sectional view of the memory cell 200 taken along a line A-A' of FIG. 5. FIG. 6B is a cross-sectional view of the memory cell 200 taken along a line B-B' of FIG. 5. FIG. 6C is a plan view of the memory cell 200 taken along a line C-C' of FIG. 6A. FIG. 6D is a plan view of the memory cell 200 taken along a line D-D' of FIG. 6A. FIG. 6E illustrates a line-type air gap AGL in detail.

Referring to FIGS. 5, 6A, 6B, 6C, and 6D, a memory cell 200 may include a cell transistor including a buried word line 206, a bit line structure BL including a bit line 213, and a capacitor 230. The buried word line 206 may extend in a first direction X, and the bit line structure BL may extend in a second direction Y. The first direction X and the second direction Y may intersect with each other.

The memory cell 200 is described in detail below.

An isolation layer 202 and an active region 203 may be formed in the substrate 201. A plurality of active regions 203 may be defined by the isolation layer 202. The substrate 201 may be formed of a material suitable for semiconductor processing. The substrate 201 may be formed of or include a semiconductor substrate. The substrate 201 may be made of a material containing silicon. For example, the substrate 201 may be formed of or include silicon, monocrystalline silicon, polysilicon, amorphous silicon, silicon germanium, monocrystalline silicon germanium, polycrystalline silicon germanium, carbon-doped silicon, combinations thereof or multilayers thereof. The substrate 201 may be formed or include other semiconductor materials, such as germanium. The substrate 201 may be formed of or include an III/V-group semiconductor substrate, for example, a compound semiconductor substrate, such as GaAs. The substrate 201 may be formed or include a Silicon On Insulator (SOI) substrate. The isolation layer 202 may be formed by any suitable process, for example, a Shallow Trench Isolation (STI) process.

A gate trench 204 may be formed in the substrate 201. A gate dielectric layer 205 may be formed conformally over the surface of the gate trench 204. A buried word line 206 may be formed to partially fill the gate trench 204 over the gate dielectric layer 205. A gate capping layer 207 may be formed over the buried word line 206. The top surface of the buried word line 206 may be positioned at a lower level than the surface of the substrate 201. The buried word line 206 may be formed of a low-resistance metal material. For example, in an embodiment, the buried word line 206 may be formed of a stack comprising a titanium nitride and a tungsten layer sequentially stacked. According to another embodiment of the present invention, the buried word line 206 may be formed of a titanium nitride alone (TiN Only). The buried word line 206 is also referred to as a buried gate electrode.

First and second impurity regions 208 and 209 may be formed in the substrate 201. The first and second impurity regions 208 and 209 may be spaced apart from each other by the gate trenches 204. The first and second impurity regions 208 and 209 may be referred to as source/drain regions. The first and second impurity regions 208 and 209 may include an N-type impurity, such as arsenic (As) or phosphorus (P). The buried word line 206, and the first and second impurity regions 208 and 209 may become a cell transistor. The cell transistor may improve a short channel effect by the buried word line 206.

A bit line contact plug 210 may be formed over the substrate 201. The bit line contact plug 210 may be coupled to the first impurity region 208. The bit line contact plug 210 may be positioned in the inside of the bit line contact hole 211. A bit line contact hole 211 may be formed in the hard mask layer 212. The hard mask layer 212 may be formed over the substrate 201. The hard mask layer 212 may be formed or include a dielectric material. The bit line contact hole 211 may expose the first impurity region 208. The lower surface of the bit line contact plug 210 may be lower than the top surface of the substrate 201. The bit line contact plug 210 may be formed of polysilicon or a metal material. A portion of the bit line contact plug 210 may have a line width which is smaller than the diameter of the bit line contact hole 211. A bit line 213 may be formed over the bit line contact plug 210. A bit line hard mask 214 may be formed over the bit line 213. The stacked structure of the bit line 213 and the bit line hard mask 214 may be referred to as a bit line structure BL. The bit line 213 may have a shape of a line that extends in a direction intersecting with the buried word line 206. A portion of the bit line 213 may be coupled to the bit line contact plug 210. From the perspective of an A-A' direction, the bit line 213 and the bit line contact plug 210 have the same line width. Therefore, the bit line 213 may extend in one direction while covering the bit line contact plug 210. The bit line 213 may be formed of or include a metal material. The bit line hard mask 214 may be formed or include a dielectric material.

A pair of air gaps AGL may be formed on both sidewalls of the bit line structure BL. The pair of the air gaps AGL may be symmetrical. The air gaps AGL may have an elongated, straight linear shape that extends in parallel to both sidewalls of the bit line structure BL. The air gaps AGL may be formed in the inside of the multi-layer spacer 216. The multi-layer spacer 216 may include a first spacer 216A and a second spacer 216B, and the air gaps AGL may be formed between the first spacer 216A and the second spacer 216B. The first spacer 216A and the second spacer 216B may be formed of or include a silicon nitride. The bottom surface of the air gaps AGL may be positioned at the same level as the top surface of the bit line contact plug 210. For example, the air gaps AGL may not be positioned on the sidewalls of the bit line contact plug 210.

The bit line contact hole 211 may be filled with a bit line contact plug 210 and a dielectric plug 215P. The bit line contact hole 211 may include a gap G defined on both sides of the bit line contact plug 210. The gap G may be filled with a liner 215L and the dielectric plug 215P. The liner 215L may be coupled to the first spacer 216A. The liner 215L may extend from the first spacer 216A. The liner 215L may be referred to as a lower portion of the first spacer 216A. For example, the liner 215L and the dielectric plug 215P may be formed of or include a silicon nitride.

A storage node contact plug SNC may be formed between the neighboring bit line structures BL. The storage node contact plug SNC may be formed in the storage node contact hole 217. The storage node contact hole 217 may have a high aspect ratio. The storage node contact plug SNC may be coupled to the second impurity region 209. The storage node contact plug SNC may include a lower plug 218 and an upper plug 220. The storage node contact plug SNC may further include an ohmic contact layer 219 between the lower plug 218 and the upper plug 220. The ohmic contact layer 219 may be formed of or include a metal silicide. The lower plug 218 may be formed of or include polysilicon, and the upper plug 220 may be formed of or include a metal material. The lower plug 218 and the bit line contact plug 210 may partially overlap with each other in a horizontal direction. The air gaps AGL may be positioned between the bit line structure BL and the storage node contact plug SNC. The bottom portion of the air gap AGL may contact the storage node contact plug SNC. The upper region of the upper plug 220 may be wider than the lower plug 218 (W10<W20).

When viewed in a direction parallel to the bit line structure BL, a plug isolation layer 221 may be formed between the neighboring storage node contact plugs SNCs. A plug isolation layer 221 may be formed between the neighboring bit line structures BL, and may provide a storage node contact hole 217 along with a hard mask layer 212. The neighboring storage node contact plugs (SNCs) may be isolated by the plug isolation layer 221. A plurality of plug isolation layers 221 and a plurality of storage node contact plugs SNC may be alternately positioned between the neighboring bit line structures BL.

The capping layer 222 may include an opening 223. The opening 223 may partially expose the top surface of the storage node contact plug SNC. For example, the upper plug 220 may be partially exposed by the opening 223. The opening 223 may not expose the air gap AGL. This is because the extension portion 222' of the capping layer 222 may protect the upper air gap AGL.

A conductive pad 224 may be formed between the storage node contact plug SNC and the capacitor 230. The conductive pad 224 may fill the opening 223. The conductive pad 224 may be electrically connected to the upper plug 220. The conductive pad 224 may be formed of or include a metal. In an embodiment, the conductive pad 224 may include tungsten.

The capacitor 230 may be formed over the conductive pad 224. The capacitor 230 may include a storage node. The storage node may include a pillar type. Although not illustrated, a dielectric layer and a plate node may be further formed over the storage node. The storage node may have a cylindrical form in addition to a pillar form.

The air gap AGL will be described in detail with reference to FIGS. 6C to 6E. FIG. 6E is an enlarged view of the reference numeral '240' shown in FIG. 6B.

The air gap AGL may be positioned between the bit line 213 and the storage node contact plug SNC. The air gap AGL may extend vertically to be positioned between the bit line hard mask 214 and the storage node contact plug SNC. A pair of first spacers 216A may be positioned on both sidewalls of the bit line structure BL. A pair of second spacers 216B may be positioned on both sidewalls of the bit line structure BL with the air gap AGL positioned between the first and second spacers 216A and 216B. The second spacer 216B may contact the storage node contact plug SNC. The first spacers 216A and the second spacers 216B may be of a low dielectric constant material. The first spacer 216A and the second spacer 216B may be formed of or include a silicon nitride.

The air gap AGL may include an upper air gap AGL-T and a lower air gap AGL-L. The upper air gap AGL-T and the lower air gap AGL-L may be in parallel to both sidewalls of the bit line structure BL. The upper air gap AGL-T may be positioned horizontally adjacent to the sidewall of the bit line hard mask 214 with the first spacer 216A positioned therebetween. The lower air gap AGL-L may be positioned horizontally adjacent to the sidewall of the bit line 213 with the first spacer 216A positioned therebetween. The upper air gap AGL-T and the lower air gap AGL-L may be continuous in the vertical direction. The upper air gap AGL-T may be a narrow air gap, and the lower air gap AGL-L may be a wide air gap. That is, the width of the upper air gap AGL-T may be narrower than the width of the lower air gap AGL-L (W40<W30). The width of the upper air gap AGL-T may be approximately 10 Å or less. The height of the upper air gap AGL-T may be lower than the height of the lower air gap AGL-L. The upper air gap AGL-T may be positioned between the bit line hard mask 214 and the upper plug 220. The lower air gap AGL-L may be positioned between the bit line 213 and the lower plug 218. A portion of the lower air gap AGL-L may extend to be positioned between the bit line hard mask 214 and the upper plug 220.

The air gap AGL may be covered by the capping layer 222. The capping layer 222 may cover the top surface of the storage node contact plug SNC and the top surface of the air gap AGL. A portion of the capping layer 222 may cap the upper portion of the upper air gap AGL-T. For example, the entrance of the upper air gap AGL-T may be capped by the extension portion 222' of the capping layer 222. The capping layer 222 may be formed or include a dielectric material. The capping layer 222 may be formed of or include a silicon nitride. The extension portion 222' of the capping layer 222 may have an elongated, straight linear shape just like the upper air gap AGL-T.

The conductive pad 224 and the upper air gap AGL-T may not be in contact with each other due to the extension portion 222' of the capping layer 222. Therefore, the conductive pad 224 may not cap the upper air gap AGL-T.

The parasitic capacitance between the bit line 213 and the storage node contact plug SNC may be reduced by the air gap AGL.

Since the conductive pad 224 is formed in the inside of the opening 223 of the capping layer 222, the bridge between the neighboring conductive pads 224 may be suppressed.

Since the thickness of the side of the upper region of the upper plug 220 is increased, the structural stability of the storage node contact plug SNC may be ensured.

FIGS. 7A to 10E are cross-sectional views illustrating a method for forming the memory cell 200 in accordance with an embodiment of the present invention. FIGS. 7A to 7E illustrate a method of forming a buried word line structure and a bit line structure. FIGS. 8A to 8G show a method of forming a multi-layer spacer. FIGS. 9A to 9I illustrate a method of forming a storage node contact plug. FIGS. 10A to 10E illustrate a method of forming an air gap, a capping layer, and a conductive pad.

Figure 7A:
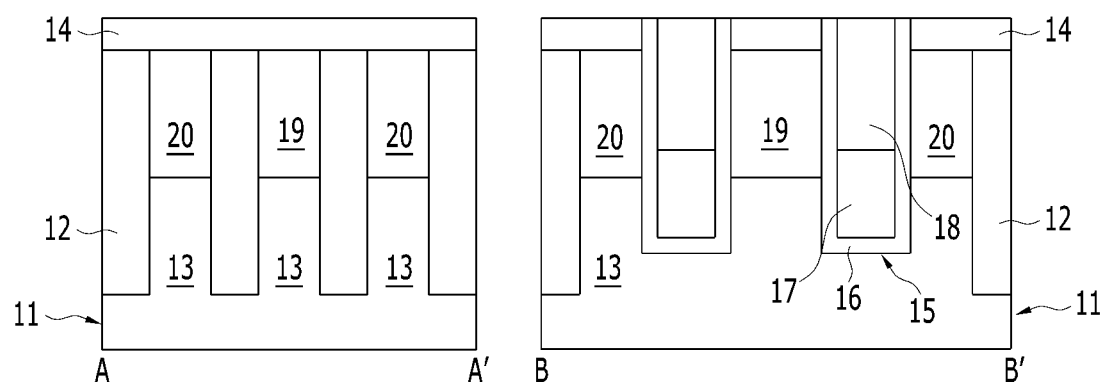
FIGS. 7A to 10E are cross-sectional views illustrating a method for forming a memory cell 200 in accordance with an embodiment of the present invention.

Referring to FIG. 7A, the isolation layer 12 may be formed in the substrate 11. The active region 13 may be defined by the isolation layer 12. The isolation layer 12 may be formed by a Shallow Trench Isolation (STI) process. The STI process may be performed as follows. The substrate 11 may be etched to form an isolation trench (not shown). The isolation trench may be filled with a dielectric material, thereby forming the isolation layer 12. The isolation layer 12 may be formed of or include a silicon oxide, a silicon nitride, or a combination thereof. A Chemical vapor deposition (CVD) process or other deposition processes may be performed to fill the isolation trench with a dielectric material. A planarization process, such as Chemical-Mechanical Polishing (CMP), may be used additionally. The active region 13 may have a shape of an island having a long axis and a short axis (refer to '203' of FIG. 5).

Subsequently, a buried word line structure may be formed in the substrate 11. The buried word line structure may include a gate trench 15, a gate dielectric layer 16 covering the bottom surface and sidewalls of the gate trench 15, a buried word line 17 partially filling the gate trench 15 over the gate dielectric layer 16, and a gate capping layer 18 formed over the buried word line 17.

A method of forming the buried word line structure may be performed as follows.

First of all, a gate trench 15 may be formed in the substrate 11. The gate trench 15 may have an elongated, straight linear shape traversing the active region 13 and the isolation layer 12. The gate trench 15 may be formed by forming a mask pattern (not shown) over the substrate 11 and etching the substrate by using the mask pattern as an etch mask. To form the gate trenches 15, a hard mask layer 14 may be used as an etch barrier. The hard mask layer 14 may be patterned by the mask pattern. The hard mask layer 14 may include, for example, a silicon oxide. In an embodiment, the hard mask layer 14 may include TEOS. The bottom surface of the gate trench 15 may be positioned at a level higher than the bottom surface of the isolation layer 12. The depth of the gate trenches 15 may be sufficiently deep to increase the average cross-sectional area of the subsequent buried word line. Therefore, the resistance of the buried word line may be reduced.

Although not illustrated, a portion of the isolation layer 12 may be recessed to protrude the upper portion of the active region 13 below the gate trench 15. For example, the isolation layer 12 below the gate trench 15 may be selectively recessed. Accordingly, a fin region (not shown) may be formed below the gate trench 15. The fin region may become part of a channel region.

Subsequently, a gate dielectric layer 16 may be formed over the bottom surface and sidewalls of the gate trenches 15. Before the gate dielectric layer 16 is formed, etch damage to the surface of the gate trench 15 may be cured. For example, after a sacrificial oxide is formed by a thermal oxidation process, the sacrificial oxide may be removed.

The gate dielectric layer 16 may be formed by a thermal oxidation process. For example, the bottom surface and sidewalls of the gate trench 15 may be oxidized to form the gate dielectric layer 16.

According to another embodiment of the present invention, the gate dielectric layer 16 may be formed by a deposition method, such as a Chemical Vapor Deposition (CVD) process or an Atomic Layer Deposition (ALD) process. The gate dielectric layer 16 may be formed of or include a high-k material, an oxide, a nitride, an oxynitride, or a combination thereof. For example, the high-k material may include a hafnium-containing material. The hafnium-containing material may be or include a hafnium oxide, a hafnium silicon oxide, a hafnium silicon oxynitride, or a combination thereof. According to another embodiment of the present invention, the high-k material may be formed or include a lanthanum oxide, a lanthanum aluminum oxide, a zirconium oxide, a zirconium silicon oxide, a zirconium silicon oxynitride, an aluminum oxide, and combinations thereof. As the high-k material, other high-k materials known in the art may be selectively used.

According to another embodiment of the present invention, the gate dielectric layer 16 may be formed by depositing a liner polysilicon layer and then performing a radical oxidation process onto the liner silicon nitride layer.

According to yet another embodiment of the present invention, the gate dielectric layer 16 may be formed by forming a liner silicon nitride layer and then performing a radical oxidation process onto the liner silicon nitride layer.

Subsequently, a buried word line 17 may be formed over the gate dielectric layer 16. The buried word line 17 may be formed by forming a conductive layer (not shown) to fill the gate trench 15 and then performing a recessing process. The recessing process may be an etch-back process, or the recessing process may be carried out by sequentially performing a Chemical Mechanical Polishing (CMP) process and an etch-back process. The buried word line 17 may have a recessed shape that fills a portion of the gate trench 15. In other words, the top surface of the buried word line 17 may be positioned at a lower level than the top surface of the active region 13. The buried word line 17 may be formed of or include a metal, a metal nitride, or a combination thereof. For example, the buried word line 17 may be formed of a titanium nitride (TiN), tungsten (W), or a titanium nitride/tungsten (TiN/W). The titanium nitride/tungsten (TiN/W) may be a structure that is formed by conformally forming a titanium nitride and then partially filling the gate trench 15 with tungsten. The titanium nitride may be used alone as the buried word line 17, which may be referred to as a buried word line 17 of a 'TiN Only' structure.

Subsequently, a gate capping layer 18 may be formed over the buried word line 17. The gate capping layer 18 may be formed or include a dielectric material. The remaining portion of the gate trench 15 may be filled with the gate capping layer 18 over the buried word line 17. The gate capping layer 18 may be formed of or include a silicon nitride. According to another embodiment of the present invention, the gate capping layer 18 may be formed of or include a silicon oxide. According to yet another embodiment of the present invention, the gate capping layer 18 may have a NON (Nitride-Oxide-Nitride) structure. The top surface of the gate capping layer 18 may be positioned at the same level as the top surface of the hard mask layer 14. To this end, a CMP process may be performed during the formation of the gate capping layer 18.

After the gate capping layer 18 is formed, a first impurity region 19 and a second impurity region 20 may be formed. The first impurity region 19 and the second impurity region 20 may be formed by a doping process, such as an implantation process. The first impurity region 19 and the second impurity region 20 may be doped with an impurity of the same conductivity type. The first impurity region 19 and the second impurity region 20 may have the same depth. According to another embodiment of the present invention (not shown), the first impurity region 19 may be deeper than the second impurity region 20. The first impurity region 19 and the second impurity region 20 may be referred to as a first source/drain region and a second source/drain region, respectively. The first impurity region 19 may be an area which is to be coupled to a bit line contact plug. The second impurity region 20 may be an area which is to be coupled to a storage node contact plug.

A cell transistor of the memory cell may be formed by the buried word line 17, the first impurity region 19, and the second impurity region 20.

Figure 7B:
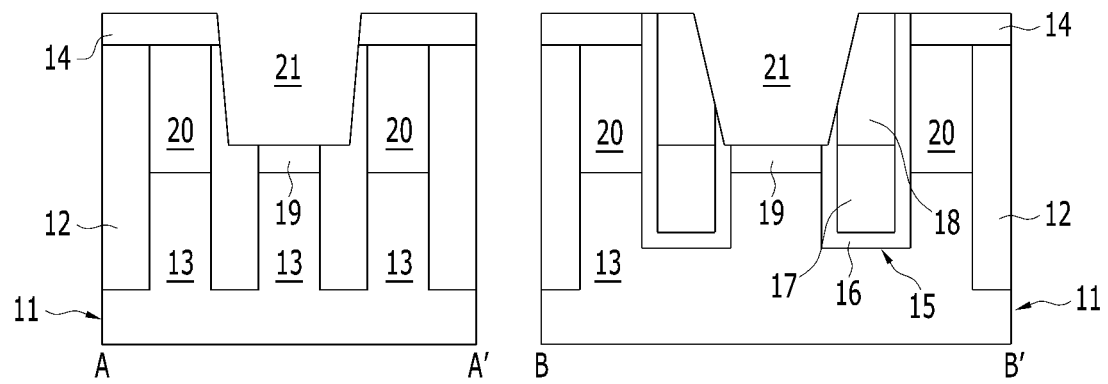

Referring to FIG. 7B, a first contact hole 21 may be formed. The hard mask layer 14 may be etched by using a contact mask (not shown) to form the first contact hole 21. The first contact hole 21 may have, for example, a circular shape or an elliptical shape from the perspective of a plan view. A portion of the substrate 11 may be exposed by the first contact hole 21. The first contact hole 21 may have a diameter that is controlled to a predetermined line width. The first contact hole 21 may have a shape that exposes a portion of the active region 13. For example, the first impurity region 19 may be exposed by the first contact hole 21. The first contact hole 21 may have a diameter that is longer than the width of the minor axis of the active region 13. Therefore, in the etching process for forming the first contact hole 21, a portion of the first impurity region 19, a portion of the isolation layer 12, and a portion of the gate capping layer 18 may be etched. In other words, the gate capping layer 18, the first impurity region 19, and the isolation layer 12 below the first contact hole 21 may be recessed to a certain depth. As a result, the bottom of the first contact hole 21 may extend into the inside of the substrate 11. As the first contact hole 21 extends, the surface of the first impurity region 19 may be recessed, and the surface of the first impurity region 19 may be positioned at a lower level than the top surface of the active region 13. The first contact hole 21 may be referred to as 'a bit line contact hole'. The first contact hole 21 may correspond to the bit line contact hole 211 of FIG. 6A.

Figure 7C:
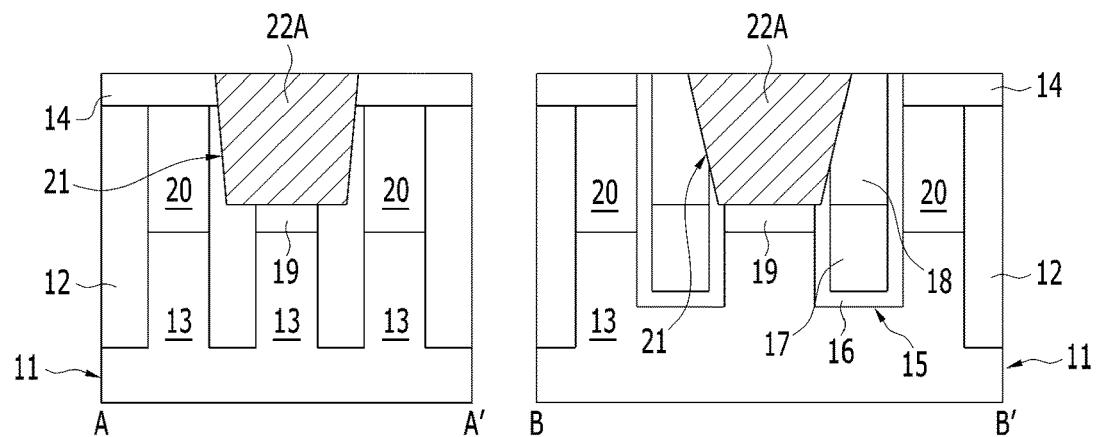

Referring to FIG. 7C, a preliminary plug 22A may be formed. For example, the preliminary plug 22A may be formed by a Selective Epitaxial Growth (SEG) process. For example, the preliminary plug 22A may be formed of or include a SEG SiP (Silicon Phosphorus). In this way, the preliminary plug 22A may be formed without voids by the selective epitaxial growth process. According to another embodiment, the preliminary plug 22A may be formed by depositing a polysilicon layer and performing a CMP process. The preliminary plug 22A may fill the first contact hole 21. The top surface of the preliminary plug 22A may be positioned at the same level as the top surface of the hard mask layer 14.

Figure 7D:
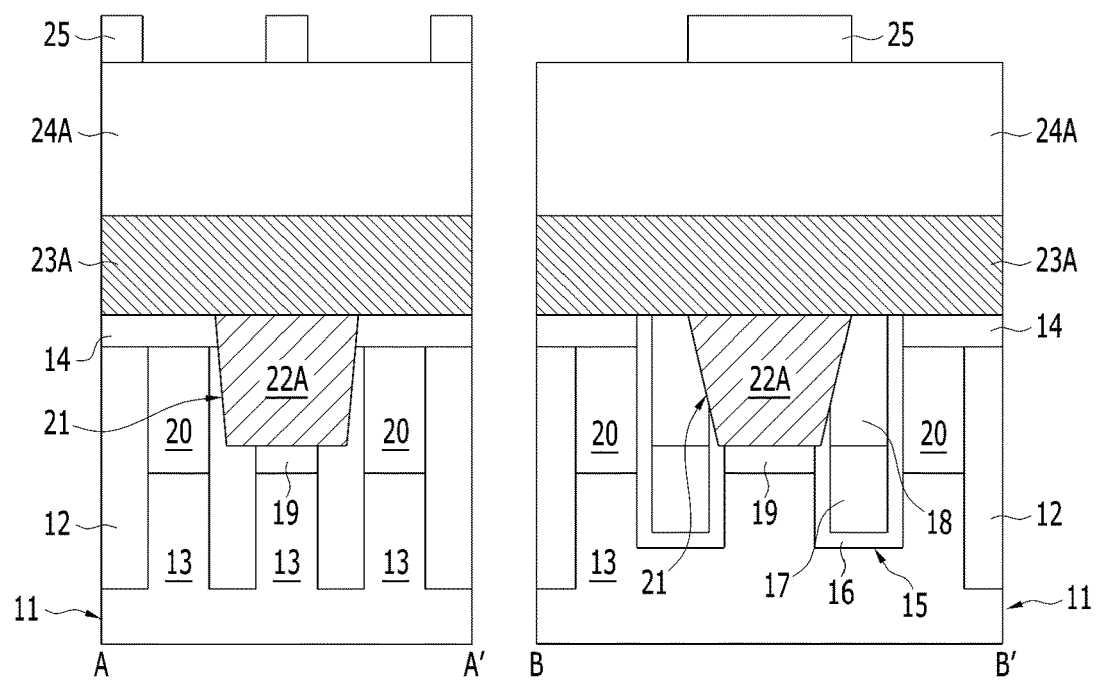

Referring to FIG. 7D, a bit line conductive layer 23A and a bit line hard mask layer 24A may be stacked. The bit line conductive layer 23A and the bit line hard mask layer 24A may be sequentially stacked over the preliminary plug 22A and the hard mask layer 14. The bit line conductive layer 23A may be formed of or include a metal-containing material. The bit line conductive layer 23A may be formed of or include a metal, a metal nitride, a metal silicide, or a combination thereof. According to an embodiment of the present invention, the bit line conductive layer 23A may be formed of or include tungsten (W). According to another embodiment of the present invention, the bit line conductive layer 23A may be formed of or include a stacked layer (TiN/W) of a titanium nitride and tungsten. Herein, the titanium nitride may serve as a barrier. The bit line hard mask layer 24A may be formed of a dielectric material having an etch selectivity with respect to the bit line conductive layer 23A and the preliminary plug 22A. The bit line hard mask layer 24A may be formed of or include a silicon oxide or a silicon nitride. According to an embodiment of the present invention, the bit line hard mask layer 24A may be formed of a silicon nitride.

A bit line mask layer 25 may be formed over the bit line hard mask layer 24A. The bit line mask layer 25 may include a photoresist pattern. The bit line mask layer 25 may be formed by a patterning method, such as Spacer Patterning Technology (SPT) or Double Patterning Technology (DPT). From the perspective of a plan view, the bit line mask layer 25 may have a form of a line extending in one direction.

Figure 7E:
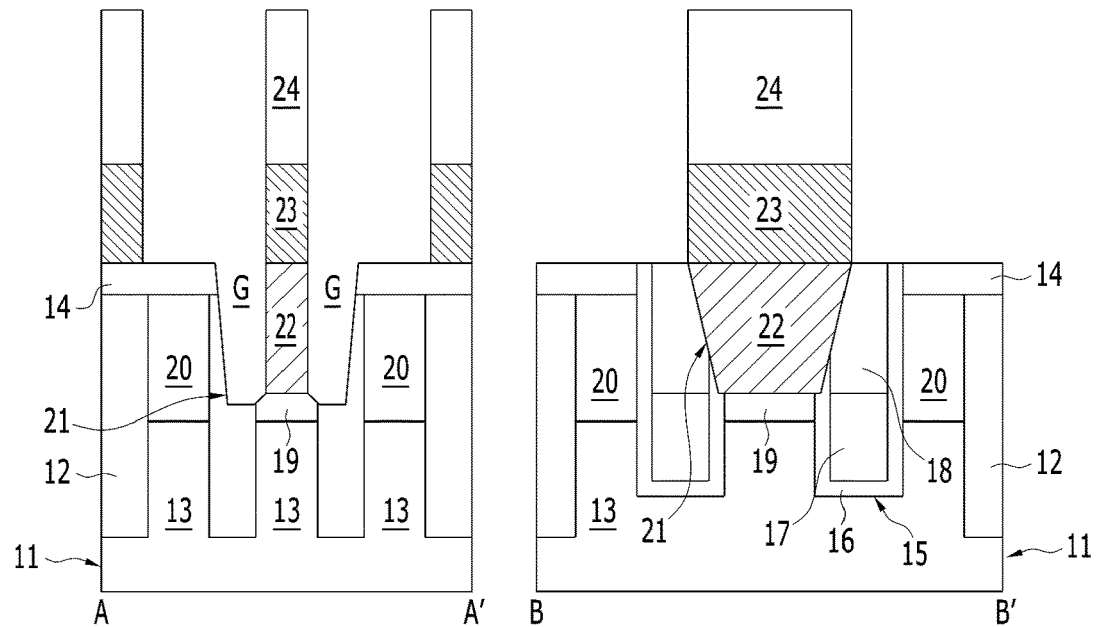

Referring to FIG. 7E, a bit line 23 and a bit line contact plug 22 may be formed. The bit line 23 and the bit line contact plug 22 may be formed simultaneously. The bit line 23 and the bit line contact plug 22 may be formed by an etching process using the bit line mask layer 25.

The bit line hard mask layer 24A and the bit line conductive layer 23A may be etched by using the bit line mask layer 25 as an etch barrier. As a result, the bit line 23 and the bit line hard mask 24 may be formed. The bit line 23 may be formed by etching the bit line conductive layer 23A. The bit line hard mask 24 may be formed by etching the bit line hard mask layer 24A.

Subsequently, the preliminary plug 22A may be etched with the same line width as the bit line 23 to form the bit line contact plug 22. The bit line contact plug 22 may be formed over the first impurity region 19. The bit line contact plug 22 may couple the first impurity region 19 and the bit line 23 to each other. The bit line contact plug 22 may be formed in the first contact hole 21. The line width of the bit line contact plug 22 may be shorter than the diameter of the first contact hole 21. Therefore, a gap G may be defined around the bit line contact plug 22.

As described above, as the bit line contact plug 22 is formed, a gap G may be formed in the first contact hole 21. This is because the bit line contact plug 22 is formed by being etched smaller than the diameter of the first contact hole 21. The gap G may not be formed in a surrounding shape surrounding the bit line contact plug 22 but may be formed independently on both sidewalls of the bit line contact plug 22. As a result, one bit line contact plug 22 and a pair of gaps G may be positioned in the inside of the first contact hole 21, and the pair of the gaps G may be isolated by the bit line contact plug 22. The bottom surfaces of the gaps G may extend into the inside of the isolation layer 12. In other words, the bottom surface of the gaps G may be positioned at a lower level than the recessed top surface of the first impurity region 19. The bottom surfaces of the gaps G may be positioned at a lower level than the bottom surface of the bit line contact plug 22.

The stacked structure where the bit line 23 and the bit line hard mask 24 are stacked in the mentioned order may be referred to as 'a bit line structure'. From the perspective of a plan view, the bit line structure may be a pattern structure having an elongated, straight linear shape that extends in one direction (refer to BL in FIG. 5).

Figure 8A:
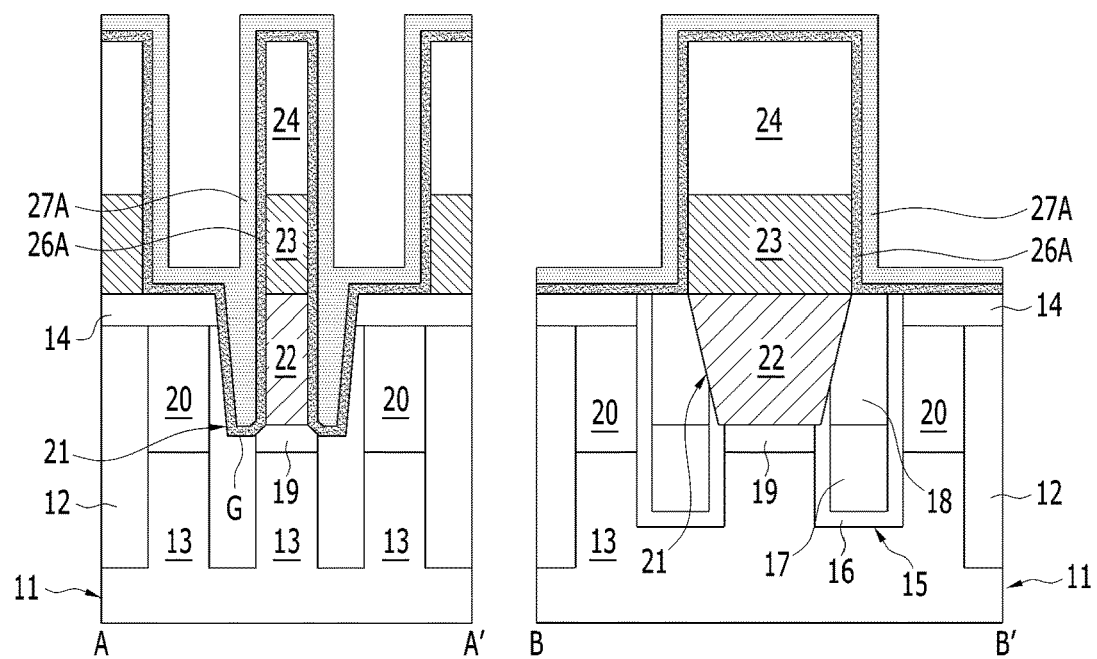

Referring to FIG. 8A, the bit line mask layer 25 may be removed and a first spacer layer 26A may be formed to cover the bit line structure and the hard mask layer 14. The first spacer layer 26A may cover both sidewalls of the bit line contact plug 22 and both sidewalls of the bit line 23. The first spacer layer 26A may cover the top surface of the bit line hard mask 24. The first spacer layer 26A may cover the surfaces of the gaps G. The first spacer layer 26A may be formed conformally. For example, the first spacer layer 26A may be formed with a uniform thickness, regardless of the shape, aspect ratio, and height of the lower structure. The first spacer layer 26A may be referred to as 'a first conformal spacer layer'.

The first spacer layer 26A may include a passivation material capable of suppressing oxidation of the bit line 23 in the subsequent process. The first spacer layer 26A may be formed to have a thin thickness capable of suppressing the oxidation of the bit line 23. When the first spacer layer 26A is thick, it is difficult to reduce the parasitic capacitance. The first spacer layer 26A may be approximately 1 nm thick. The first spacer layer 26A may be formed or include a dielectric material. The first spacer layer 26A may be a non-oxide-based material. The first spacer layer 26A may be a nitride-based material. The first spacer layer 26A may be formed of or include a silicon nitride. The first spacer layer 26A may have a low-k constant of approximately 7.5. The first spacer layer 26A may be referred to as 'a protective layer'. The first spacer layer 26A may be formed conformally without filling the gaps G. The first spacer layer 26A may protect the bit line 23 and the bit line contact plug 22 from the subsequent processing.

A plug spacer layer 27A may be formed over the first spacer layer 26A. The plug spacer layer 27A may be formed or include a dielectric material. The plug spacer layer 27A may be a non-oxide-based material. The plug spacer layer 27A may be a nitride-based material. The plug spacer layer 27A may be formed of or include a silicon nitride. The plug spacer layer 27A and the first spacer layer 26A may be formed of the same material.

The plug spacer layer 27A may be formed non-conformally. In other words, the thickness at the sidewall of the bit line structure and the thickness at which the gap G is filled may be different from each other. The plug spacer layer 27A may completely fill the gaps G over the first spacer layer 26A. The plug spacer layer 27A may cover the surface of the first spacer layer 26A.

Figure 8B:
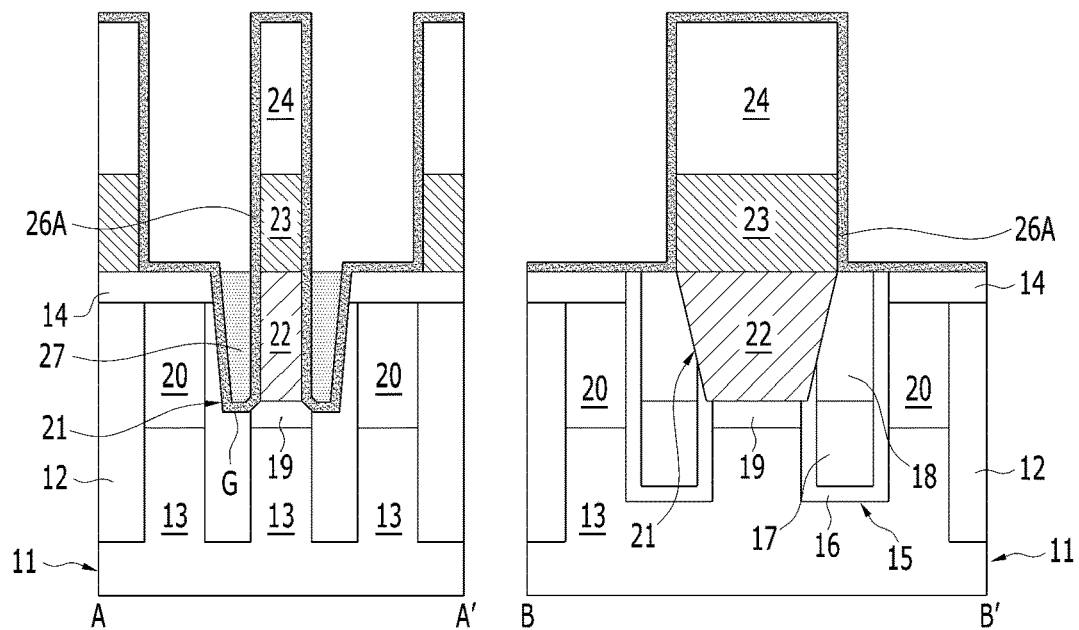

Referring to FIG. 8B, a dielectric plug 27 may be formed. The plug spacer layer 27A may be recessed to form the dielectric plug 27. An etch-back process may be performed to recess the plug spacer layer 27A. A pair of dielectric plugs 27 may be formed on both sidewalls of the bit line contact plugs 22. A first spacer layer 26A may be positioned between the dielectric plug 27 and the bit line contact plug 22. The top surface of the dielectric plug 27 may be controlled lower than the upper surface of the bit line structure. For example, the dielectric plug 27 may not be positioned adjacent to the sidewalls of the bit line 23. The dielectric plug 27 and the bit line 23 may not overlap with each other in the horizontal direction. The plug spacer layer 27A may be removed from the top surface of the hard mask layer 14. The bottom surface of the dielectric plug 27 may be positioned at a lower level than the top surfaces of the active region 13 and the hard mask layer 14.

The dielectric plug 27 may have a pillar shape filling the gaps G. A pair of dielectric plugs 27 may be positioned in the inside of the first contact hole 21. The dielectric plug 27 may protect the gaps G from being filled with any material in the subsequent process. Also, the open area between the bit line structures may be widened as the plug spacer layer 27A is removed from the sidewalls of the bit line 23.

As described above, the bit line contact plug 22, the first spacer layer 26A, and a pair of dielectric plugs 27 may fill the first contact hole 21. The dielectric plugs 27 may be adjacent to both sidewalls of the bit line contact plugs 22. In other words, the dielectric plug 27 and the bit line contact plug 22 may overlap with each other in the horizontal direction. Herein, the horizontal direction may be a direction parallel to the top surface of the substrate 11.

The bit line contact plug 22 and the dielectric plug 27 may be formed perpendicular to the top surface of the substrate 11. When the first spacer layer 26A and the dielectric plug 27 include a silicon nitride, a dielectric structure of an NN (Nitride/Nitride) stack may be formed on both sidewalls of the bit line contact plug 22. The first spacer layer 26A may be formed on both sidewalls of the bit line 23 and may extend to be positioned on both sidewalls of the bit line contact plug 22. A portion of the first spacer layer 26A may be positioned between the dielectric plug 27 and the hard mask layer 14. As a result, the first spacer layer 26A lines the surfaces of the gaps G, and the dielectric plug 27 fills over the lined first spacer layer 26A. A portion of the first spacer layer 26A that lines the surface of the gaps G may be referred to as 'a liner layer' or 'a lining spacer layer'.

Figure 8C:
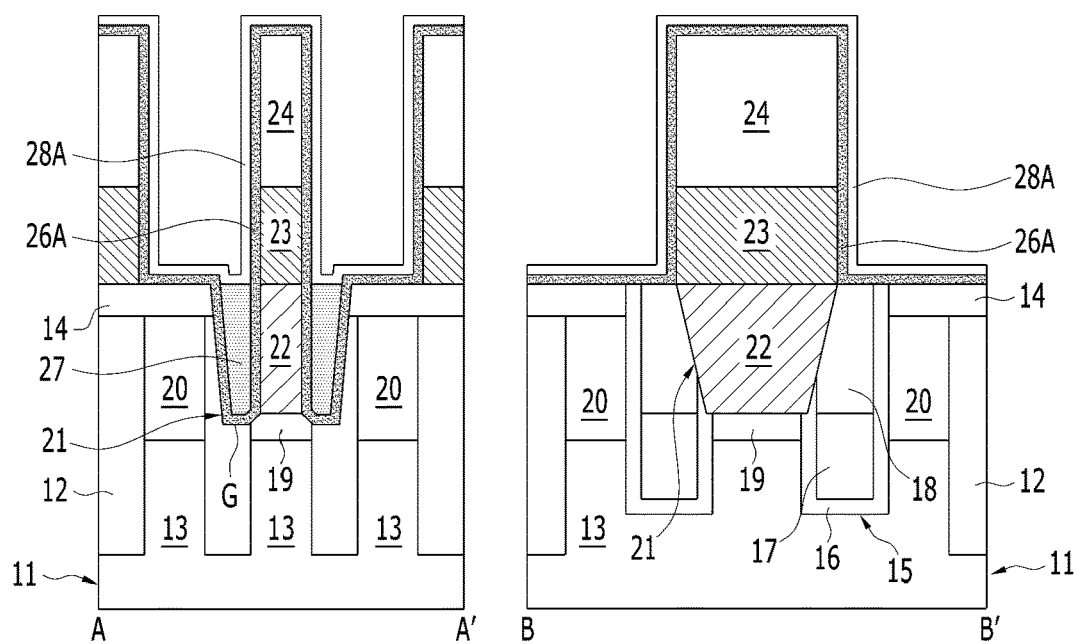

Referring to FIG. 8C, a sacrificial spacer layer 28A may be formed over the dielectric plug 27 and the first spacer layer 26A. The sacrificial spacer layer 28A may be formed of a sacrificial material. The sacrificial spacer layer 28A may be formed of a material which is different from the first spacer layer 26A and the dielectric plug 27. The first spacer layer 26A and the dielectric plug 27 may be etch stop layers that are used when the sacrificial spacer layer 28A is removed. The sacrificial spacer layer 28A may include an oxide-based material. The sacrificial spacer layer 28A may be formed of or include a low-k constant material. The sacrificial spacer layer 28A may have a dielectric constant which is lower than the dielectric plug 27 and the first spacer layer 26A. The sacrificial spacer layer 28A may be formed of or include a silicon oxide. The sacrificial spacer layer 28A may be thicker than the first spacer layer 26A. The sacrificial spacer layer 28A and the first spacer layer 26A may be of the same thickness. The sacrificial spacer layer 28A may be formed conformally. The sacrificial spacer layer 28A may be deposited by a Chemical Vapor Deposition (CVD) process, an Atomic Layer Deposition (ALD) process, or the like. The sacrificial spacer layer 28A may be formed to have a uniform thickness regardless of the shape, aspect ratio, and height of the lower structure.

Figure 8D:
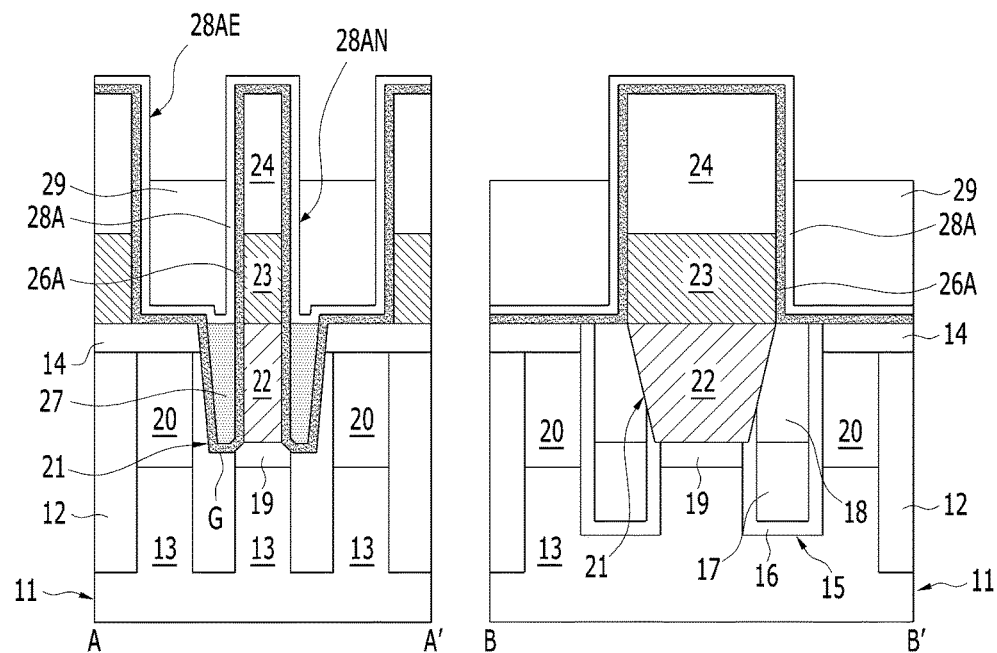

Referring to FIG. 8D, an etch barrier layer 29 may be formed. The etch barrier layer 29 may be formed or include a material that becomes an etch barrier during a slimming process of the sacrificial spacer layer 28A. The etch barrier layer 29 may include a carbon-containing material. The etch barrier layer 29 may include a carbon layer which is formed by a Spin-On-Coating process. The etch barrier layer 29 may be formed without voids.

Subsequently, the etch barrier layer 29 may be recessed. An etch-back process may be performed to recess the etch barrier layer 29. The top surface of the etch barrier layer 29 may be positioned at a lower level than the top surface of the bit line hard mask 24. The top surface of the etch barrier layer 29 and the top surface of the bit line 23 may be positioned at least at the same level. For example, the top surface of the etch barrier layer 29 may be positioned at the same level or higher level than the top surface of the bit line 23.

A portion of the sacrificial spacer layer 28A may be exposed by the etch barrier layer 29. For example, a portion of the sacrificial spacer layer 28A positioned at a level higher than the top surface of the etch barrier layer 29 may be exposed. A portion of the sacrificial spacer layer 28A exposed by the etch barrier layer 29 may be referred to as an exposed portion 28AE. Another portion of the sacrificial spacer layer 28A that is not exposed by the etch barrier layer 29 may be referred to as a non-exposed portion 28AN.

As described above, when the etch barrier layer 29 is formed, the exposed portion 28AE and the non-exposed portion 28AN may be defined in the sacrificial spacer layer 28A.

Figure 8E:
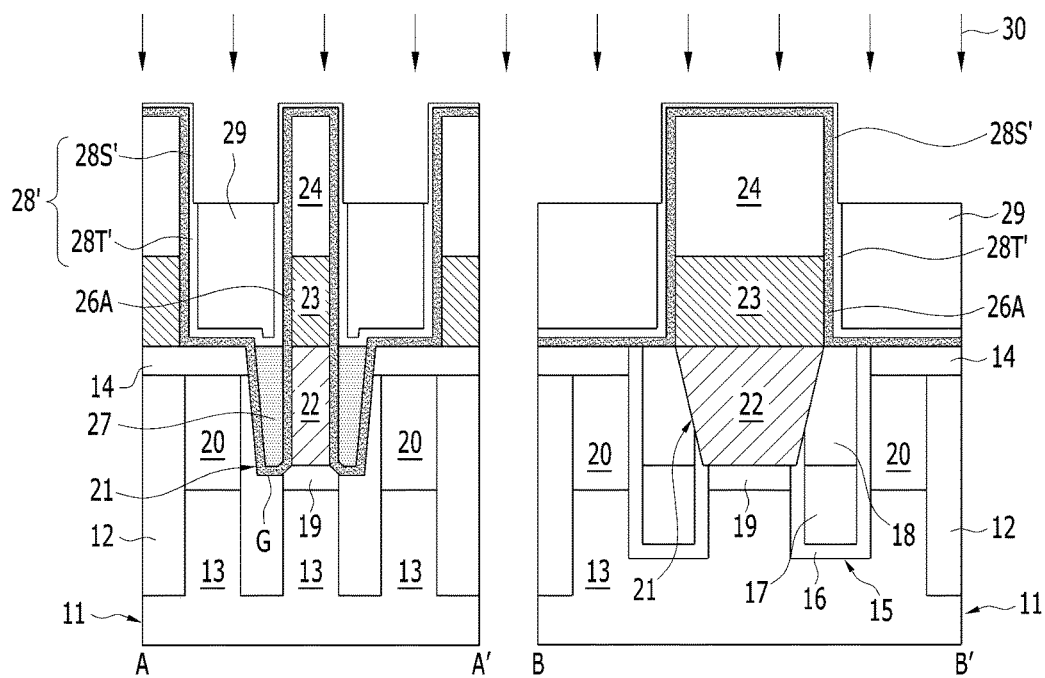

Referring to FIG. 8E, a slimming process 30 may be performed. The slimming process 30 may be a process of making a portion of the sacrificial spacer layer 28A to become thinner than a remaining portion. For example, the exposed portion 28AE of the sacrificial spacer layer 28A exposed by the etch barrier layer 29 may be slimmed to become thinner than the non-exposed portion 28AN.

After the slimming process 30, the sacrificial spacer layer 28A may include a thin portion 28S' and a thick portion 28T'. The thin portion 28S' may be a thin portion which is made thin by the slimming process 30, and the thick portion 28T' may be a portion which is protected by the etch barrier layer 29. The thick portion 28T' may have an initial thickness of the sacrificial spacer layer 28A. The thin portion 28S' may be thinner than the thick portion 28T' and may be less than half the thickness of the thick portion 28T'. The thickness of the thin portion 28S' may be approximately 10 Å or less.

The sacrificial spacer layer 28A onto which the slimming process 30 is performed may be referred to as 'a non-conformal sacrificial spacer layer 28'. The non-conformal sacrificial spacer layer 28' may include the thin portion 28S' and a thick portion 28T'. The thin portion 28S' may be positioned on the sidewall of the bit line hard mask 24. The thicker portion 28T' may be positioned on the sidewall of the bit line 23. The upper portion of the thick portion 28T' may extend to partially overlap with the sidewall of the bit line hard mask 24. The thin portion 28S' may not be positioned on the sidewall of the bit line 23. According to another embodiment of the present invention, the height of the etch barrier layer 29 may be reduced such that the thin portion 28S' partially overlaps with the upper portion of the bit line 23.

The slimming process 30 may include a dry etch process or a wet etch process.

Figure 8F:
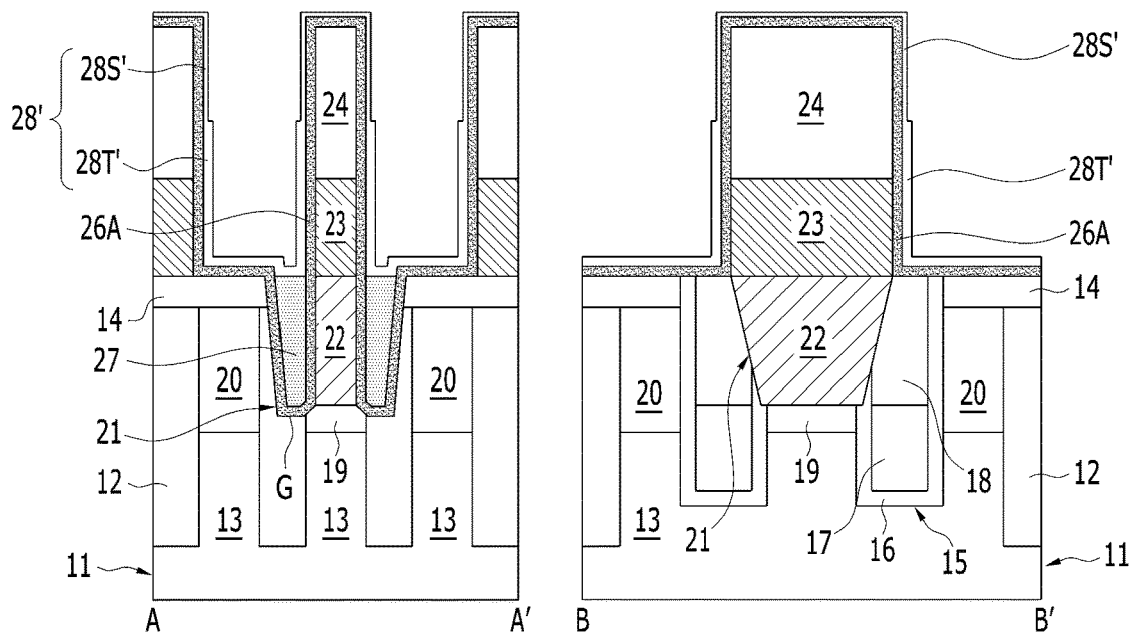

Referring to FIG. 8F, the etch barrier layer 29 may be removed. The etch barrier layer 29 may be removed by a dry etch process or a wet etch process. The non-conformal sacrificial spacer layer 28' may remain after the etch barrier layer 29 is removed.

Figure 8G:
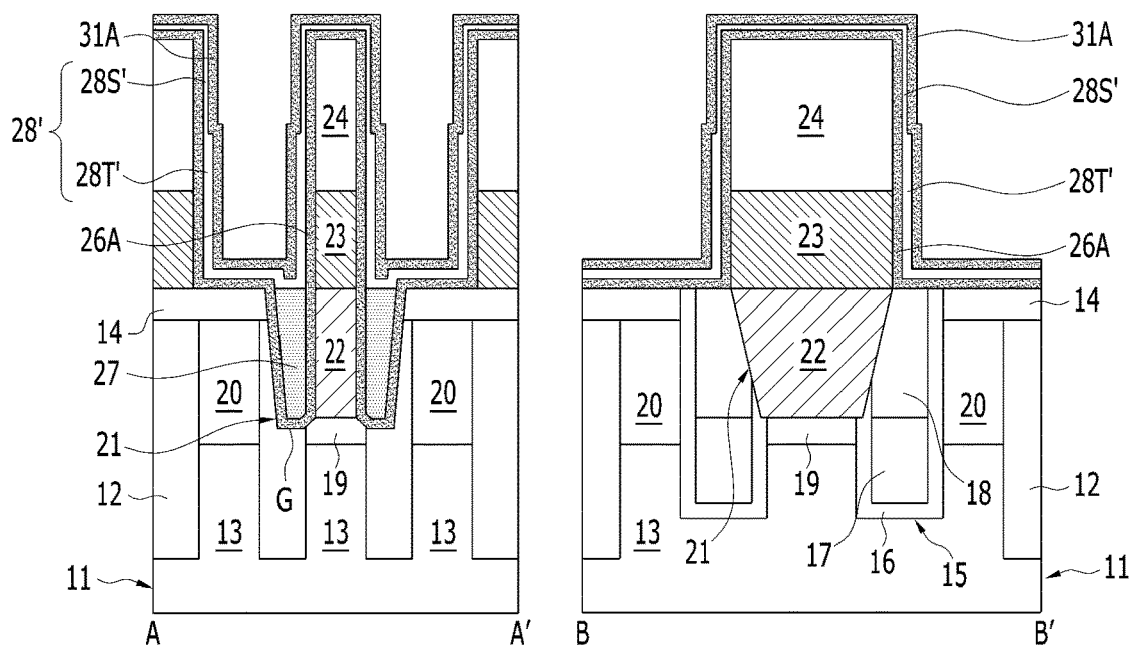

Referring to FIG. 8G, a second spacer layer 31A may be formed over the non-conformal sacrificial spacer layer 28'.

The second spacer layer 31A may cover the non-conformal sacrificial spacer layer 28'. The second spacer layer 31A may be formed or include a dielectric material. The second spacer layer 31A may be formed of or include a low-k material. The second spacer layer 31A may be of a material which is different from the non-conformal sacrificial spacer layer 28'. The second spacer layer 31A may be formed conformally. The second spacer layer 31A may be referred to as 'a second conformal spacer layer'. The second spacer layer 31A may include a nitride based material. The thickness of the second spacer layer 31A may be the same as the thickness of the first spacer layer 26A. The thickness of the second spacer layer 31A may be the same as the thickness of the thick portion 28T' of the non-conformal sacrificial spacer layer 28'. The second spacer layer 31A may be thicker than the thin portion 28S' of the non-conformal sacrificial spacer layer 28'.

As described above, the multi-layer spacer layer may be formed by forming the second spacer layer 31A. The multi-layer spacer layer may include a first spacer layer 26A, a non-conformal sacrificial spacer layer 28' and a second spacer layer 31A. The multi-layer spacer layer may cover the bit line structure.

Figure 9A:
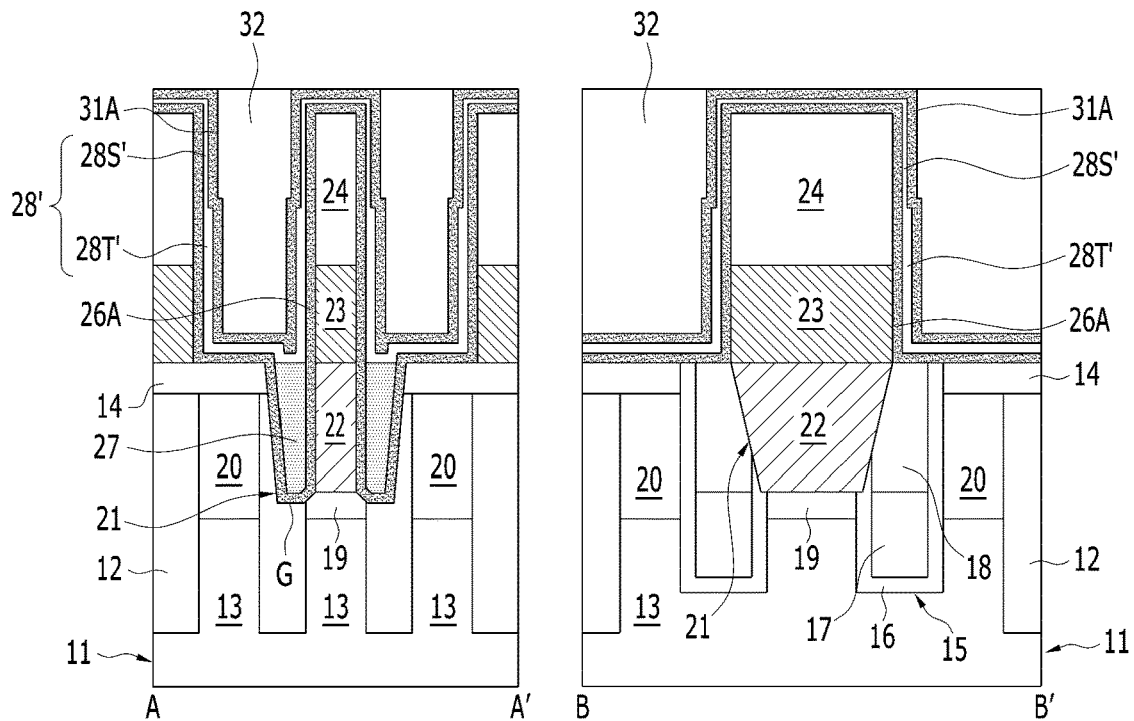

Referring to FIG. 9A, a sacrificial gap-fill layer 32 may be formed. The sacrificial gap-fill layer 32 may fill the space between the bit line structures over the second spacer layer 31A. The sacrificial gap-fill layer 32 may be formed of a dielectric material. The sacrificial gap-fill layer 32 may be formed of a silicon oxide. The sacrificial gap-fill layer 32 may include a Spin On Dielectric (SOD) material.

Subsequently, the sacrificial gap-fill layer 32 may be planarized to expose the second spacer layer 31A covering the top surface of the bit line hard mask 24. As a result, a line-shaped sacrificial gap-fill layer 32 may be formed between the bit line structures. The sacrificial gap-fill layer 32 may extend parallel to the bit line structure. According to another embodiment of the present invention, the first spacer layer 26A, the non-conformal sacrificial spacer layer 28', and the second sacrificial spacer layer 28' may be planarized to expose the top surface of the bit line hard mask 24 during the planarization process of the sacrificial gap-fill layer 32.

Figure 9B:
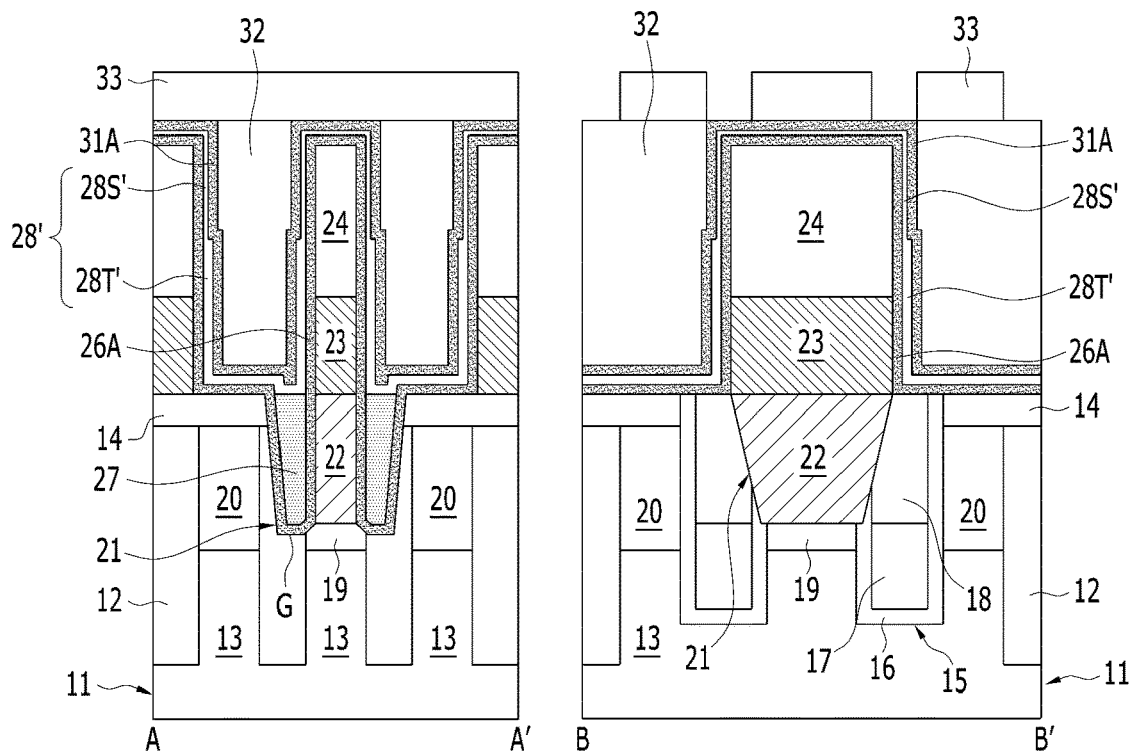

Referring to FIG. 9B, a line-shaped mask pattern 33 may be formed over the bit line structure and the sacrificial gap-fill layer 32. The line-shaped mask pattern 33 may be patterned in a direction intersecting with the bit line structure. The line-shaped mask pattern 33 may have a line shape. The line-shaped mask pattern 33 may include a photoresist pattern. The line-shaped mask pattern 33 may have a pattern of a line/space shape, i.e., a plurality of spaced apart parallel lines. From the perspective of a plan view, the space of the line-shaped mask pattern 33 may overlap with the buried word line 17. The top surface of the sacrificial gap-fill layer 32 may be partially exposed by the line-shaped mask pattern 33.

Figure 9C:
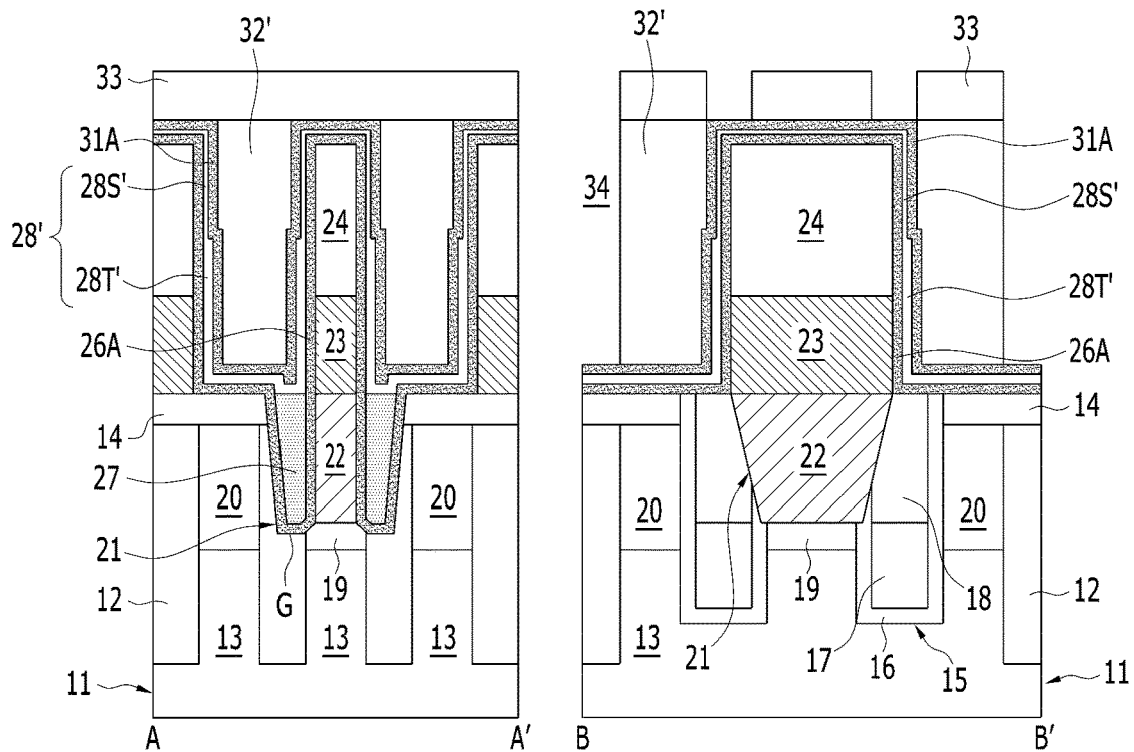

Referring to FIG. 9C, a pre-isolation part 34 may be formed in a sacrificial gap-fill layer 32. The sacrificial gap-fill layer 32 may be etched by using the line-shaped mask pattern 33 as an etch mask. As a result, the pre-isolation part 34 may be formed, and the sacrificial gap-fill layer pattern 32' may remain between the neighboring pre-isolation parts 34.

The pre-isolation part 34 may have a form of overlapping with the buried word line 17. According to another embodiment of the present invention, the pre-isolation part 34 may have a line width which is narrower than the line width of the buried word line 17.

Figure 9D:
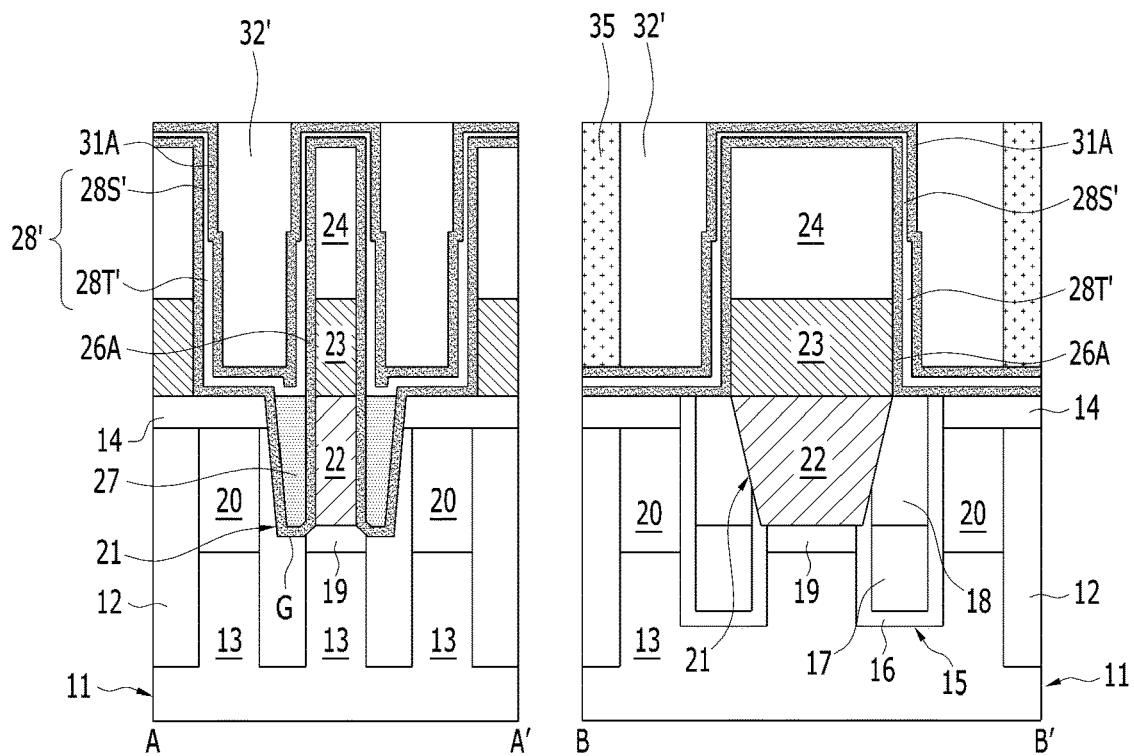

Referring to FIG. 9D, the line-shaped mask pattern 33 may be removed. A plug isolation layer 35 may be formed in the pre-isolation part 34. The plug isolation layer 35 may be formed by forming a silicon nitride to gap-fill the pre-isolation part 34 and then performing a planarization process. The plug isolation layer 35 may be formed between the bit line structures in a direction that intersects with the bit line structure. The sacrificial gap-fill layer pattern 32' may be formed between the bit line structures in a direction that intersects with the bit line structure. The plug isolation layer 35 and the sacrificial gap-fill layer pattern 32' may be positioned alternately in a direction parallel to the bit line structure. The plug isolation layer 35 may completely fill the pre-isolation part 34.

The plug isolation layer 35 and the second spacer layer 31A may be of the same material. According to another embodiment of the present invention, the plug isolation layer 35 and the second spacer layer 31A may be of different materials. The plug isolation layer 35 and the second spacer layer 31A may have an etch selectivity with respect to the sacrificial gap-fill layer pattern 32'.

Figure 9E:
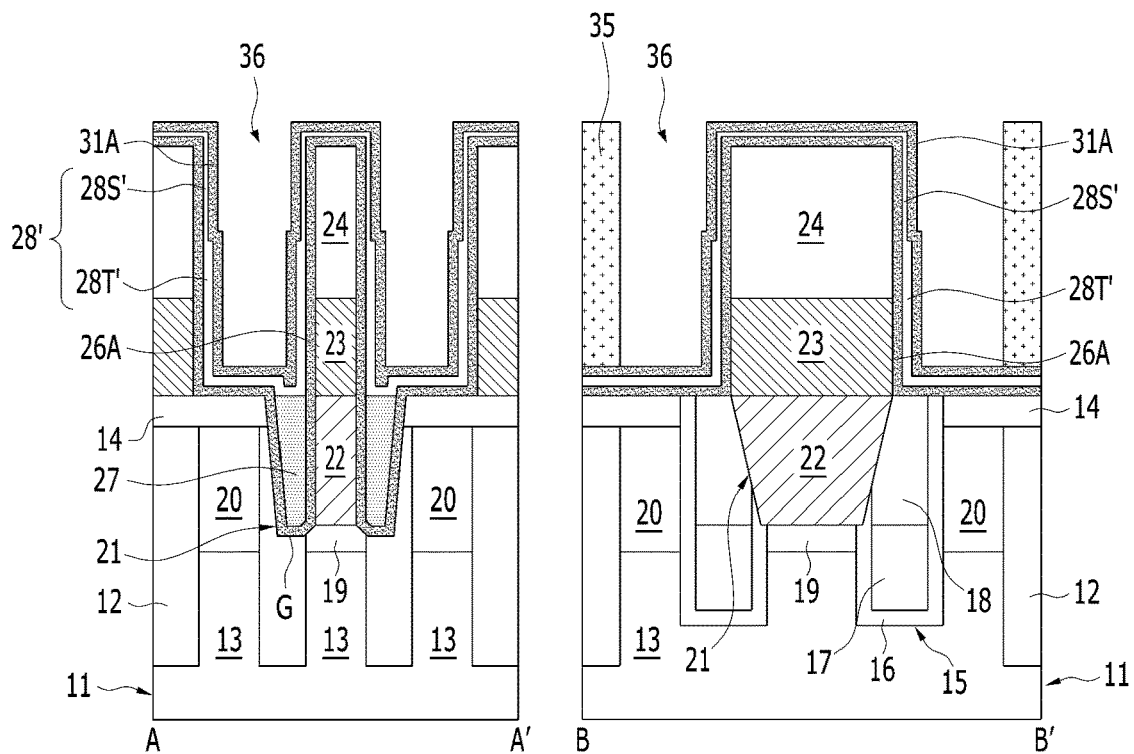

Referring to FIG. 9E, the sacrificial gap-fill layer pattern 32' may be removed. The space from which the sacrificial gap-fill layer pattern 32' is removed may become a preliminary second contact hole 36'. In a direction parallel to the bit line structure, the preliminary second contact holes 36' and the plug isolation layers 35 may be alternately formed. The neighboring preliminary second contact holes 36' may be arranged in a shape isolated by the bit line structure and the plug isolation layer 35. The preliminary second contact hole 36' may have a rectangular hole shape from the perspective of a plan view.

A dip-out process may be applied to remove the sacrificial gap-fill layer pattern 32'. The sacrificial gap-fill layer pattern 32' may be selectively removed without loss of the first spacer layer 26A, the non-conformal sacrificial spacer layer 28' and the second spacer layer 31A by the dip-out process.

Figure 9F:
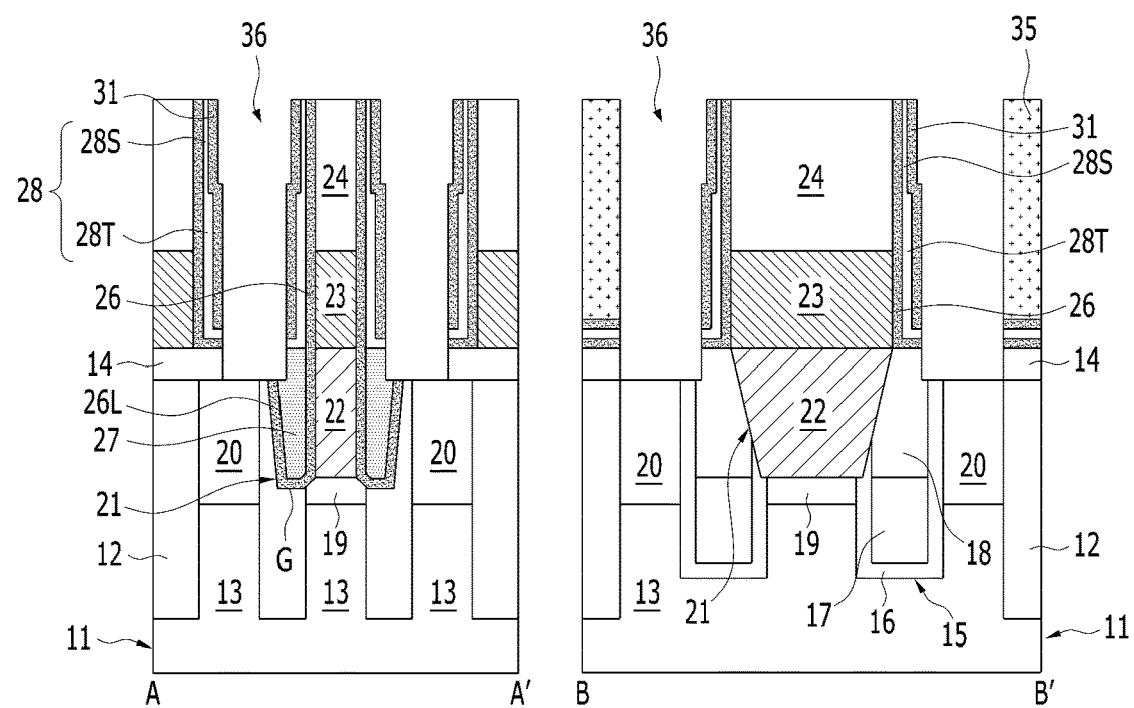

Referring to FIG. 9F, the underlying materials may be etched to be self-aligned to the preliminary second contact holes 36'. As a result, the second contact hole 36 may be formed. The second contact hole 36 may have a shape that the preliminary second contact hole 36' extends downwardly.

The second contact hole 36 may be formed by sequentially etching the second spacer layer 31A, the non-conformal sacrificial spacer layer 28', the first spacer layer 26A, and the hard mask layer 14 under the preliminary second contact hole 36'. The second contact hole 36 may expose the surface of the substrate 11. While the second contact hole 36 is formed, the second spacer layer 31A, the non-conformal sacrificial spacer layer 28', and the first spacer layer 26A may be removed to expose the top surface of the bit line hard mask 24. The upper portion of the plug isolation layer 35 may be partially etched while the second contact hole 36 is formed. The top surface of the plug isolation layer 35 and the top surface of the bit line hard mask 24 may be positioned at the same level.

The bottom portion of the second contact hole 36 may extend into the inside of the substrate 11. The isolation layer 12, the gate capping layer 18 and the second impurity region 20 may be recessed to a certain depth during the formation of the second contact hole 36. The bottom surface of the second contact hole 36 may be positioned at a lower level than the top surface of the bit line contact plug 22. The bottom surface of the second contact hole 36 may be positioned at a higher level than the bottom surface of the bit line contact plug 22. The second contact hole 36 may correspond to the storage node contact hole 217 of FIG. 6A.

A plurality of spacers may be formed on the sidewalls of the bit line structure by the etch process for forming the second contact holes 36. The spacers may include materials having different dielectric constants.

The spacers may include a first spacer 26, a non-conformal spacer 28, and a second spacer 31. The first spacer 26 may contact the sidewall of the bit line structure. The non-conformal spacer 28 may cover the first spacer 26. The second spacer 31 may cover the non-conformal spacer 28. The non-conformal spacer 28 may include a thick spacer 28T and a thin spacer 28S. The thick spacer 28T may be positioned on the sidewalls of the bit line 23, and the thin spacer 28S may be positioned on the sidewall of the bit line hard mask 24. The upper portion of the thick spacer 28T may extend to be positioned on the sidewall of the lower portion of the bit line hard mask 24.

The first spacer 26, the thick spacer 28T, and the second spacer 31 may be sequentially stacked on the sidewall of the bit line 23. The first spacer 26, the thin spacer 28S, and the second spacer 31 may be sequentially stacked on the sidewall of the upper portion of the bit line hard mask 24. The first spacer 26 may extend to the sidewall of the bit line contact plug 22, while being formed on the sidewall of the bit line 23. The extension portion of the first spacer 26 may be referred to as 'a liner 26L'. The first spacer 26 and the second spacer 31 may be conformally formed. The first spacer 26 and the second spacer 31 may be referred to as 'a first conformal spacer and a second conformal spacer', respectively. The first spacer 26 and the second spacer 31 may be thicker than the thin spacer 28S. The first spacers 26, the thick spacers 28T and the second spacer 31 may have the same thickness. The thin spacer 28S may be thinner than the thick spacer 28T. The thickness of the thin spacer 28S may be approximately 10 Å or less. The liner 26L and the dielectric plug 27 may be sequentially stacked on the sidewall of the bit line contact plug 22.

Figure 9G:
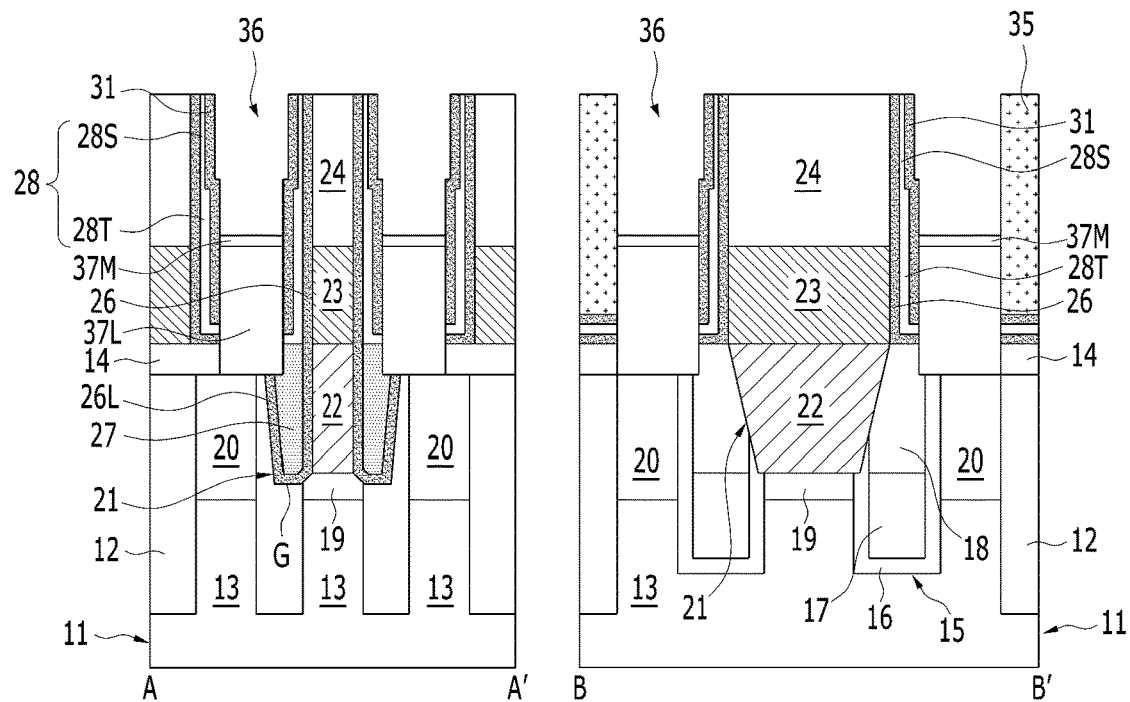
Figure 9H:
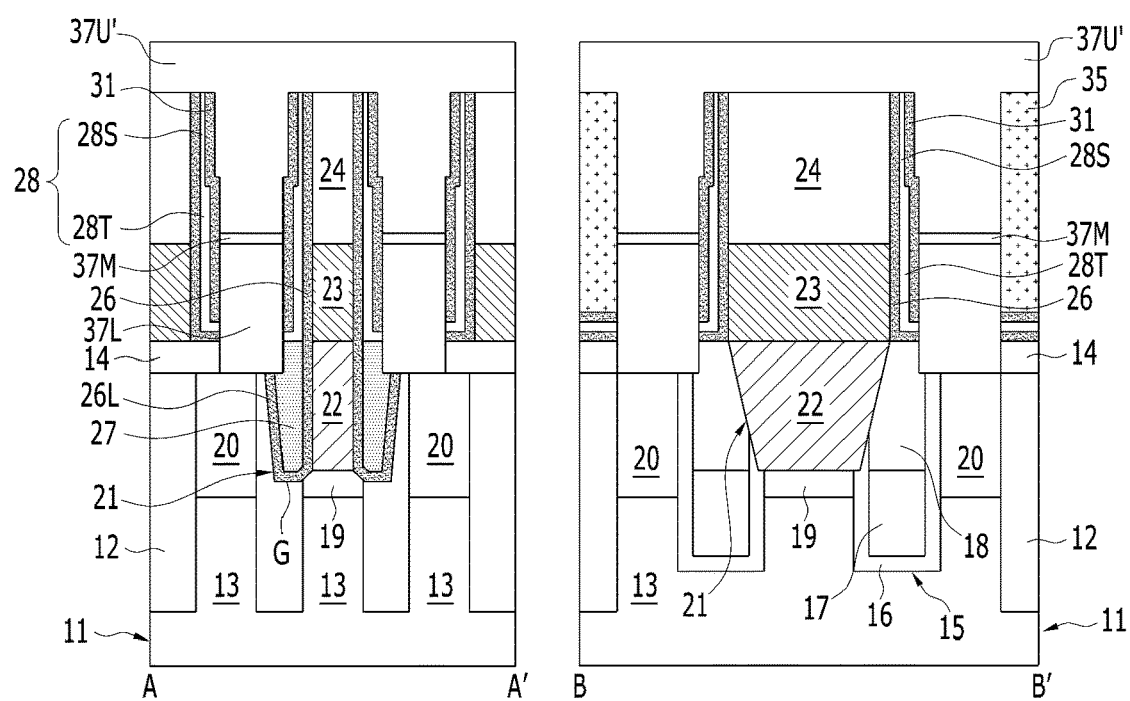
Figure 9I:
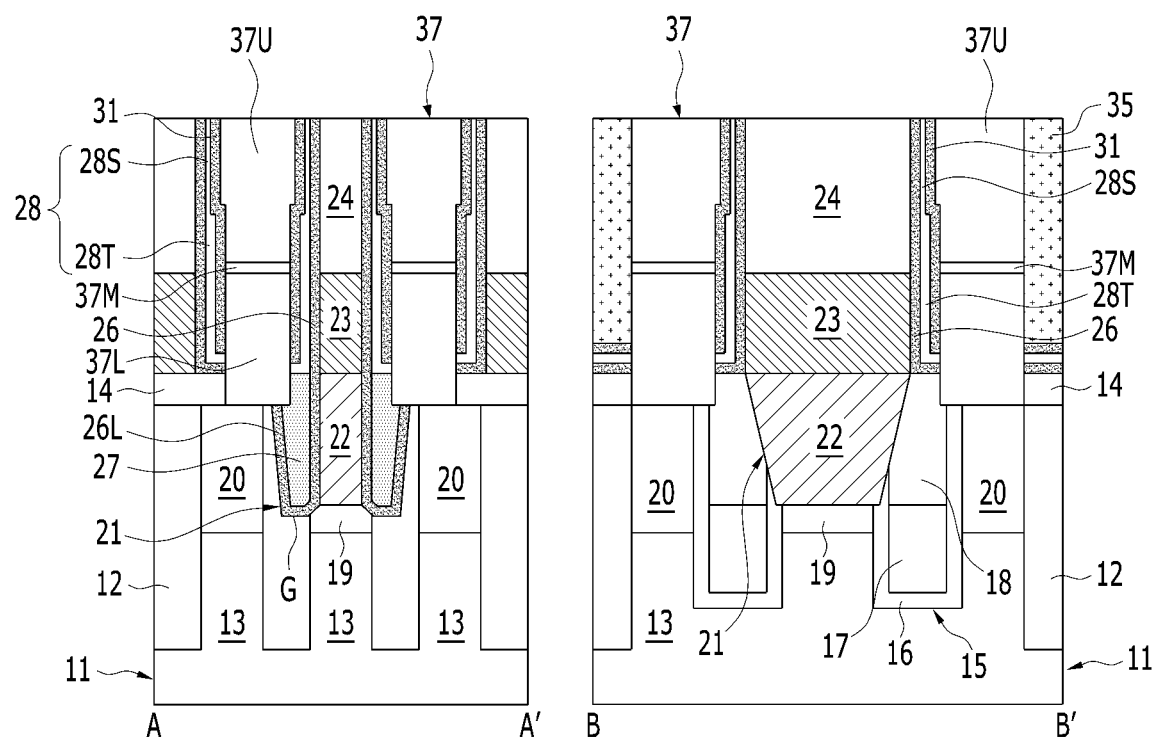

Referring to FIGS. 9G to 9I, a storage node contact plug 37 may be formed. The storage node contact plug 37 may fill the second contact hole 36. The storage node contact plug 37 may contact the second impurity region 20. The storage node contact plug 37 may be positioned adjacent to the bit line structure. From the perspective of a top view, a plurality of storage node contact plugs 37 may be positioned between a plurality of bit line structures. In a direction parallel to the bit line 23, a plurality of storage node contact plugs 37 and a plurality of plug isolation layers 35 may be positioned alternately.

The storage node contact plug 37 may be formed as the lower plug 37L, the ohmic contact layer 37M, and the upper plug 37U are sequentially stacked.

First of all, referring to FIG. 9G, a lower plug 37L may be formed. The lower plug 37L may be formed of or include a silicon-containing material. The lower plug 37L may be formed of or include polysilicon. Polysilicon may be doped with an impurity. The lower plug 37L may be coupled to the second impurity region 20. The top surface of the lower plug 37L may be higher than the top surface of the bit line 23. After polysilicon is deposited to fill the second contact hole 36 to form the lower plug 37L, a planarization process and an etch-back process may be sequentially performed.

Subsequently, an ohmic contact layer 37M may be formed over the lower plug 37L. The ohmic contact layer 37M may be formed of or include a metal silicide. Deposition and annealing processes are performed onto a silicidable metal layer to form the ohmic contact layer 37M. As a result, a silicidation reaction may occur at the interface between the silicidable metal layer and the lower plug 37L, thereby forming a metal silicide layer. The ohmic contact layer 37M may be formed of or include a cobalt silicide. According to an embodiment of the present invention, the ohmic contact layer 35M may be formed of or include a 'CoSi$_2$-phase' cobalt silicide. When the cobalt silicide of the CoSi$_2$-phase is formed as the ohmic contact layer 37M, a cobalt silicide of a low resistance may be formed while the contact resistance is improved at the same time.

Referring to FIG. 9H, a metal-containing layer 37U' may be formed over the ohmic contact layer 37M. The metal-containing layer 37U' may be a single layer of titanium, a titanium nitride or tungsten, or multiple layers thereof. The metal-containing layer 37U' may fill the upper region of the second contact hole 36 over the ohmic contact layer 37M. The lower region of the second contact hole 36 may be filled with the ohmic contact layer 37M and the lower plug 37L. The metal-containing layer 37U' may cover the entire structure including the bit line structure while filling the second contact hole 36.

Referring to FIG. 9I, an upper plug 37U may be formed. A planarization process may be performed onto the metal-containing layer 37U' to form the upper plug 37U. The upper plug 37U may be formed while filling the second contact hole 36 over the ohmic contact layer 37M. The upper plug 37U may be formed of or include a metal-containing layer. The upper plug 37U may be formed or include a material containing tungsten. The upper plug 37U may be formed of or include a tungsten layer or a tungsten compound. Although not illustrated, a barrier layer may be positioned between the upper plug 37U and the ohmic contact layer 37M. The barrier layer may be formed or include a titanium or a titanium/titanium nitride stack. The planarization for forming the upper plug 37U may be or include a Chemical Mechanical Polishing (CMP) process.

The storage node contact plug 37 may be referred to as a hybrid plug or a semi-metal plug because the lower plug 37L is formed of or includes polysilicon and the ohmic contact layer 37M and the upper plug 37U is formed of or includes a metal material.

The first spacer 26, the non-conformal spacer 28 and the second spacer 31 may be positioned between the bit line structure and the storage node contact plug. The first spacer 26, the non-conformal spacer 28 and the second spacer 31 may be positioned between the bit line 23 and the lower plug 37L. The dielectric plug 27 and the liner 26L may be positioned between the bit line contact plug 22 and the lower plug 37L. Since the first spacer 26 and the second spacer 31 include a silicon nitride and the non-conformal spacer 28 includes a silicon oxide, a NON (Nitride-Oxide-Nitride) spacer may be positioned between the bit line 23 and the lower plug 37L. Since the first spacer 26 and the third spacer 31 include a silicon nitride and the non-conformal spacer 28 includes a silicon oxide, a NON (Nitride-Oxide-Nitride)

spacer may be positioned between the bit line hard mask 24 and the upper plug 37U. Since the liner 26L includes a silicon nitride and the dielectric plug 27 includes a silicon nitride, a NN (Nitride-Nitride) structure may be positioned between the bit line contact plug 22 and the lower plug 37L. The non-conformal spacer 28 may have a shape of a line, i.e., an elongated, straight linear shape that is parallel to both sidewalls of the bit line structure.

After the storage node contact plug 37 is formed, an air gap 38 may be formed subsequently.

Figure 10A:
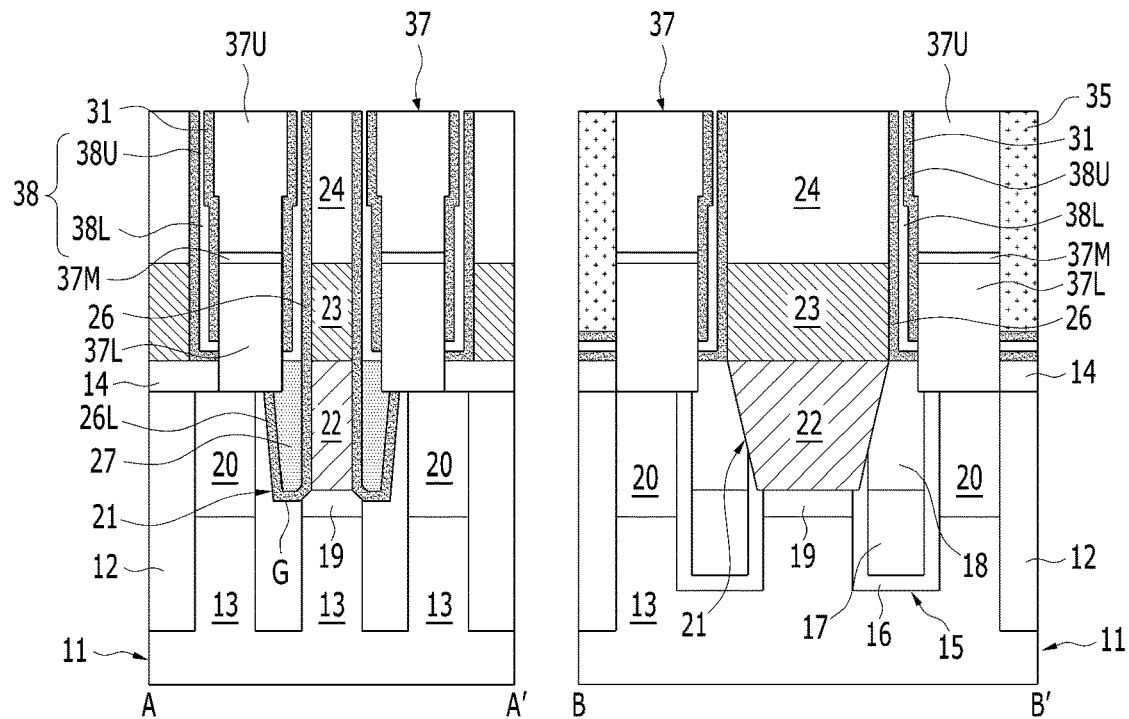

Referring to FIG. 10A, an upper air gap 38U may be formed. The thin spacer 28S may be removed to form the upper air gap 38U. A cleaning process (or a dip-out process) using a wet chemical may be performed to remove the thin spacer 28S. For example, when the thin spacer 28S contains a silicon oxide, hydrofluoric acid (HF) may be used.

Subsequently, the lower air gap 38L may be formed. The thick spacer 28T may be removed to form the lower air gap 38L. A cleaning process (or a dip-out process) using a wet chemical may be performed to remove the thick spacer 28T. For example, when the thick spacer 28T contains a silicon oxide, hydrofluoric acid (HF) may be used.

The upper air gap 38U and the lower air gap 38L may be formed continuously. For example, after the thin spacer 28S is removed by using hydrofluoric acid, the thick spacer 28T may be removed continuously. The lower air gap 38L and the upper air gap 38U may be continuous in the vertical direction. The upper air gap 38U may have a smaller width than the lower air gap 38L. The upper air gap 38U may be a narrow air gap, and the lower air gap 38L may be a wide air gap. The height of the upper air gap 38U may be lower than the height of the lower air gap 38L. The upper air gap 38U may be positioned adjacent to both sidewalls of the bit line hard mask 24. The lower air gap 38L may be adjacent to both sidewalls of the bit line 23. The upper portion of the lower air gap 38L may extend to be adjacent to the sidewall of the lower portion of the bit line hard mask 24. According to another embodiment of the present invention, the bottom portion of the upper air gap 38U may extend to be adjacent to the sidewall of the upper portion of the bit line 23.

The upper air gap 38U and the lower air gap 38L may form one air gap 38, and the air gap 38 may be positioned on both sidewalls of the bit line structure to form a pair of air gaps 38. The air gaps 38 of the pair may be symmetrical with the same height, and may be in parallel to both sidewalls of the bit line 23.

As described above, since the air gap 38 is formed after the storage node contact plug 37 is formed, the cleaning time (or the dip-out time) may be reduced and the residue removal path may be easily secured. For example, since there is no obstructing structure when a wet chemical, such as hydrofluoric acid, flows in, the non-conformal sacrificial spacer 28 may be quickly removed. Also, the air gap 38 may be formed within a short period of time without any remaining residue of the non-conformal sacrificial spacers 28. Since the air gap 38 is formed without any residue, the horizontal symmetry of the air gap 38 may be stably maintained.

Figure 10B:
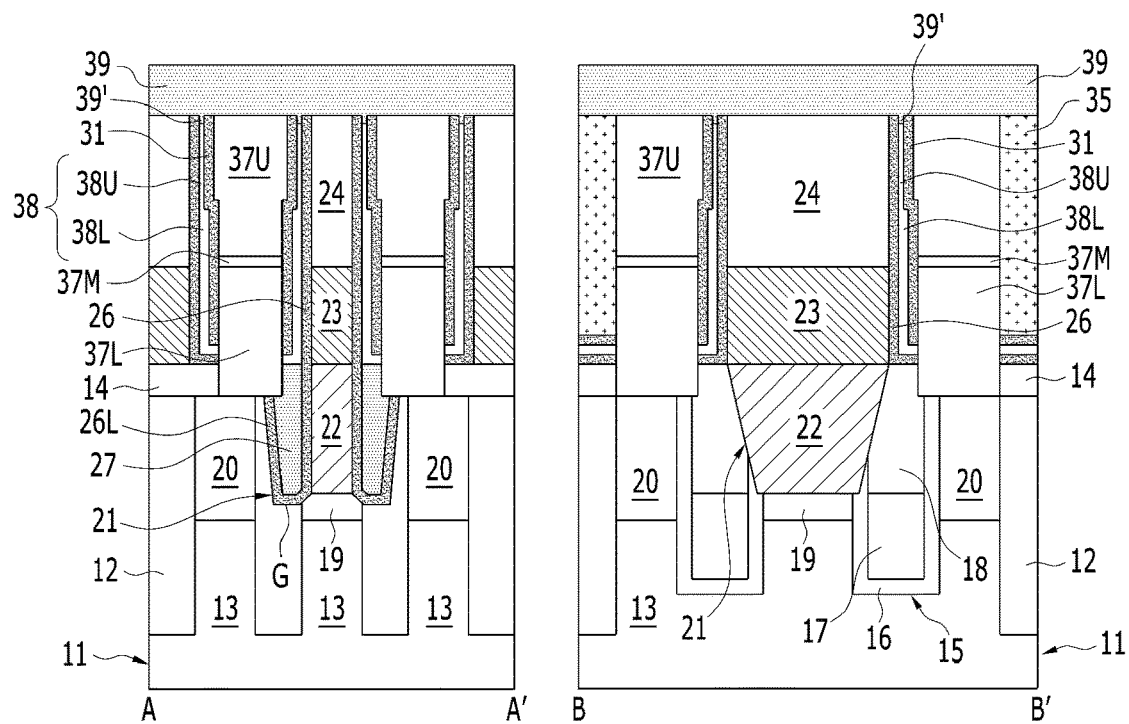

Referring to FIG. 10B, a capping layer 39 may be formed. The capping layer 39 may cover the storage node contact plug 37 and the air gap 38. A portion of the capping layer 39 may cap the upper portion of the air gap 38. For example, the entrance of the upper air gap 38U may be capped by the extension portion 39' of the capping layer 39. The capping layer 39 may be formed or include a dielectric material. The capping layer 39 may be formed of or include a silicon nitride. The capping layer 39 may include a poor step-coverage material. For example, the capping layer 39 may be formed by a Plasma Enhanced Chemical Vapor Deposition (PECVD) process. The capping layer 39 may increase the structural stability of the air gap 38.

Since the upper air gap 38U has a narrow width, only the entrance of the upper air gap 38U is filled by the capping layer 39 and the remaining portion of the upper air gap 38U and the lower air gap 38L may not be filled. Accordingly, since the height of the air gap 38 is sufficiently secured, the effect of reducing the parasitic capacitance may be increased. Also, since the underlying structure before the formation of the capping layer 39 is flat, the capping layer 39 may be uniformly formed. As a result, the capping uniformity of the upper air gap 38U may be obtained. Therefore, a pair of air gaps 38 may be formed symmetrically on both sidewalls of the bit line 23.

A multi-layer spacer including the air gap 38 may be formed on both sidewalls of the bit line 23. The multi-layer spacer may include the first spacer 26, the air gap 38, and the second spacer 31. Since the first and second spacers 26 and 31 may be formed of or include a silicon nitride, a multi-layer spacer of an 'N-Air-N' structure may be formed.

Figure 10C:
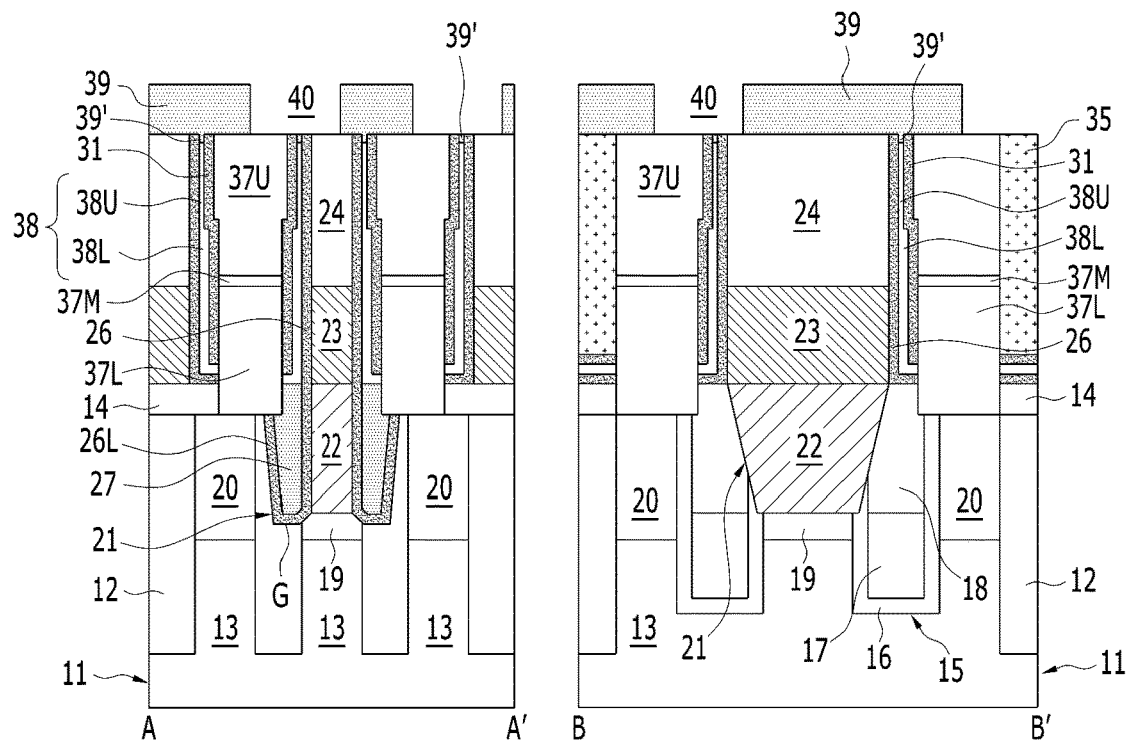

Referring to FIG. 10C, the opening 40 may be formed. A portion of the capping layer 39 may be etched to form the opening 40. The opening 40 may expose a portion of the top surface of the storage node contact plug 37. For example, the upper plug 37U may be exposed by the opening 40. When the opening 40 is formed, the air gap 38 may not be exposed. This is because the extension portion 39' of the capping layer 39 may protect the upper air gap 38U. Also, when the opening 40 is formed, there is no loss of the upper plug 37U and the bit line hard mask 24. The symmetry of a pair of the air gaps 38 may be maintained even if the extension portion 39' of the capping layer 39 is formed.

Figure 10D:
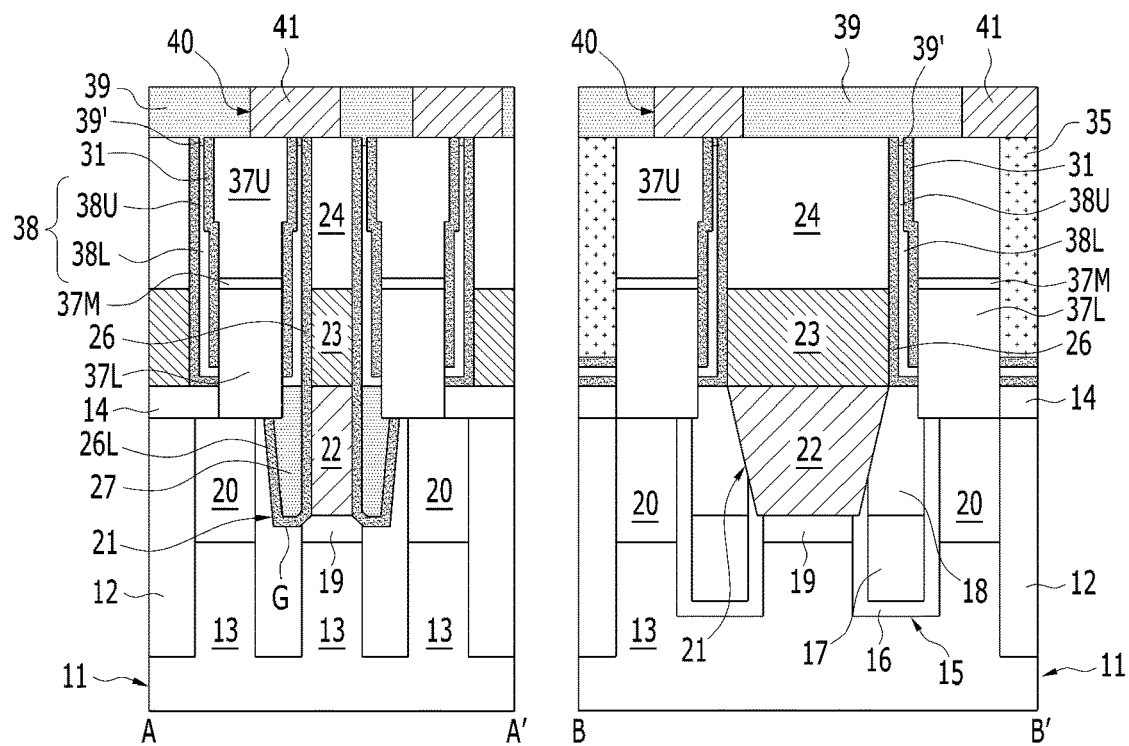

Referring to FIG. 10D, the conductive pad 41 may be formed. The conductive pad 41 may fill the opening 40. In order to form the conductive pad 41, a Chemical Mechanical Polishing (CMP) process may be performed after a conductive material is deposited to fill the opening 40. The conductive pad 41 may be formed of or include a metal material. For example, the conductive pad 41 may be formed or include tungsten. The conductive pad 41 may be electrically connected to the storage node contact plug 37. The conductive pad 41 may be electrically connected to the upper plug 37U of the storage node contact plug 37. The conductive pad 41 and the upper plug 37U may partially overlap with each other. The conductive pad 41 and the bit line hard mask 24 may partially overlap with each other. As the conductive pad 41 is formed, the overlay margin with a subsequent capacitor 42 may be improved. Since the conductive pad 41 is formed by performing the CMP process, the bridge between the neighboring conductive pads 41 may be suppressed.

The air gap 38 may be capped by the capping layer 39 and may not be capped by the conductive pad 41.

Figure 10E:
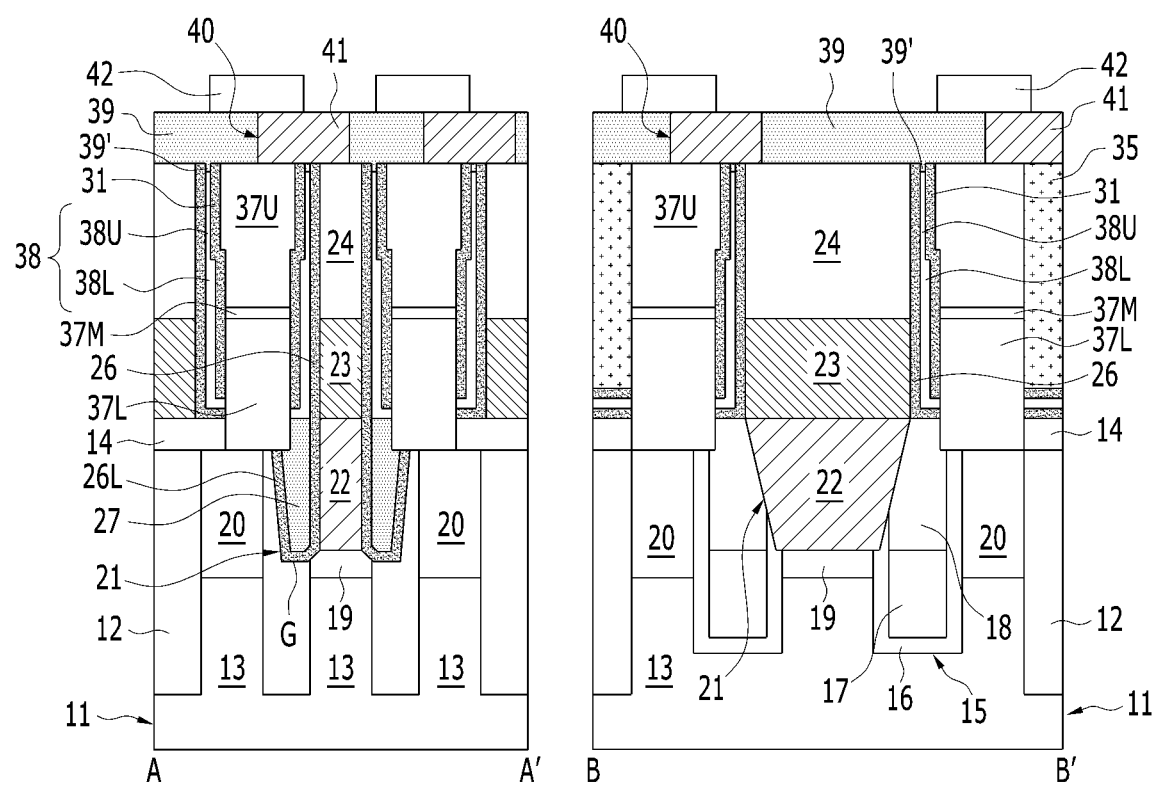

Referring to FIG. 10E, a capacitor 42 may be formed over the conductive pad 41. The capacitor 42 may include a storage node, a dielectric layer, and a plate node.

According to the above-described embodiment, the electrical dielectric characteristics of the bit line 23 and the storage node contact plug 37 may be improved by forming the air gap 38. For example, parasitic capacitance between the bit line 23 and the storage node contact plug 37 may be reduced. Since the parasitic capacitance is reduced, the sensing margin of the memory cell may be improved.

Figure 11A:
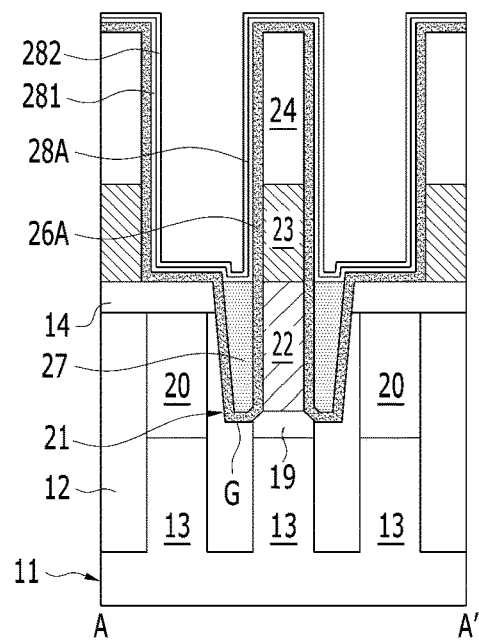
FIGS. 11A to 11C are cross-sectional views illustrating a method for forming a memory cell 200 in accordance with another embodiment of the present invention.
Figure 11B:
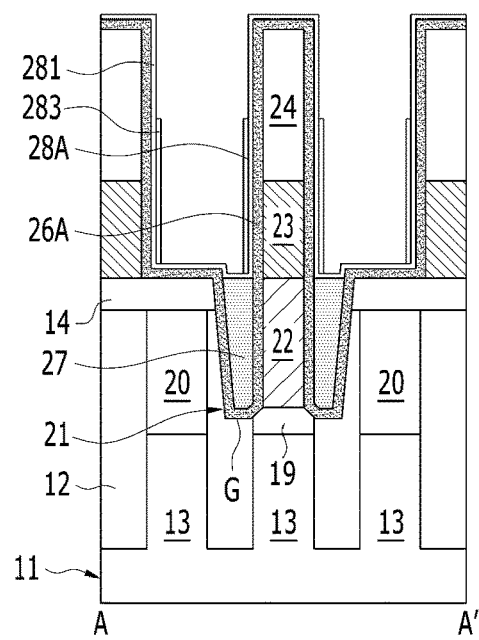
Figure 11C:
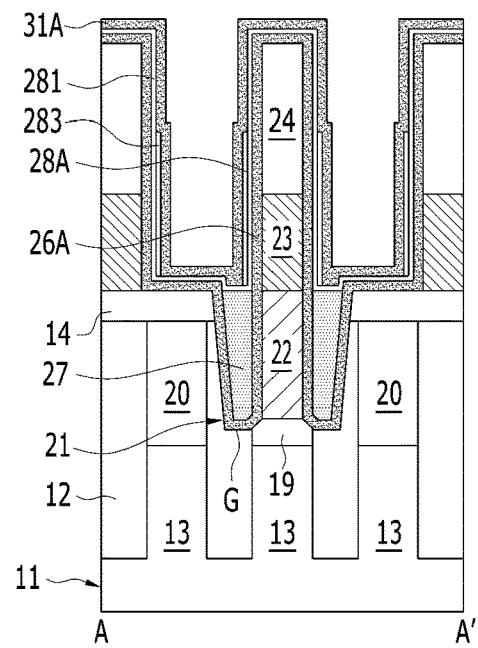

FIGS. 11A to 11C illustrate a method of forming the memory cell 200 in accordance with another embodiment of the present invention. Hereafter, FIGS. 11A to 11C illustrate the forming method according to a direction A-A' shown in FIG. 5. FIGS. 11A to 11C show a method of forming a non-conformal sacrificial spacer layer in accordance with another embodiment of the present invention. Other constituent elements, except for the non-conformal sacrificial spacer layer, may be similar to those of FIGS. 7A to 10E.

First, a bit line structure including the bit line contact plug 22 and the bit line 23 may be formed through a series of the processes shown in FIGS. 7A to 7E.

Subsequently, through a series of the processes shown in FIGS. 8A and 8B, the first spacer layer 26A covering the bit line structure may be formed. The dielectric plug 27 filling the gap G may be formed over the first spacer layer 26A.

Subsequently, as illustrated in FIG. 11A, a first sacrificial spacer layer 281 may be formed over the dielectric plug 27 and the first spacer layer 26A. The first sacrificial spacer layer 281 may be formed of a sacrificial material. The first sacrificial spacer layer 281 may be formed of a material which is different from those of the first spacer layer 26A and the dielectric plug 27. The first sacrificial spacer layer 281 may be formed or include an oxide-based material. The first sacrificial spacer layer 281 may be formed of or include a silicon oxide. The first sacrificial spacer layer 281 may be thinner than the first spacer layer 26A. The first sacrificial spacer layer 281 may be conformally formed. The first sacrificial spacer layer 281 may be deposited by a Chemical Vapor Deposition (CVD) process, an Atomic Layer Deposition (ALD) process, or the like. The thickness of the first sacrificial spacer layer 281 may be approximately 10 Å or less.

Subsequently, a second sacrificial spacer layer 282 may be formed. The second sacrificial spacer layer 282 may be as thick as the first sacrificial spacer layer 281. The second sacrificial spacer layer 282 may be thicker than the first sacrificial spacer layer 281. The second sacrificial spacer layer 282 may have an etch selectivity with respect to the first sacrificial spacer layer 281. The second sacrificial spacer layer 282 may be formed of a material which is different from those of the first spacer layer 26A and the dielectric plug 27. The second sacrificial spacer layer 282 may be formed of an oxide-based material. The first sacrificial spacer layer 281 and the second sacrificial spacer layer 282 may be formed of different oxides. The second sacrificial spacer layer 282 may be conformally formed.

The second sacrificial spacer layer 282 may be deposited by a Chemical Vapor Deposition (CVD) process, an Atomic Layer Deposition (ALD) process, or the like.

The first sacrificial spacer layer 281 and the second sacrificial spacer layer 282 may be formed of or include a silicon oxide, but they may have different etch selectivities. For example, the second sacrificial spacer layer 282 may have a faster etch rate than the first sacrificial spacer layer 281. Herein, the fast etch rate may be obtained under the same dry etch conditions. One between the first sacrificial spacer layer 281 and the second sacrificial spacer layer 282 may be SRO (Silicon-rich $SiO_2$), and the other may be $SiO_2$. The SRO (Silicon-rich $SiO_2$) may have a slower etching rate than $SiO_2$. One between the first sacrificial spacer layer 281 and the second sacrificial spacer layer 282 may be doped $SiO_2$, and the other may be undoped $SiO_2$. Herein, a dopant may include fluorine, boron, phosphorus, carbon, and the like. The doped $SiO_2$ and the undoped $SiO_2$ may have different etch rates. The doped $SiO_2$ may have a faster etch rate than the undoped $SiO_2$. According to another embodiment of the present invention, the first sacrificial spacer layer 281 and the second sacrificial spacer layer 282 may include the same silicon oxide, but may be etched by using different etch gases. Accordingly, the first sacrificial spacer layer 281 and the second sacrificial spacer layer 282 may have an etch selectivity.

Referring to FIG. 11B, a second sacrificial spacer 283 may be formed. The second sacrificial spacer 283 may be formed by etching a portion of the second sacrificial spacer layer 282. The second sacrificial spacer layer 282 may be etched by a dry etch process. The second sacrificial spacer layer 282 may be etched by an etch-back process. The second sacrificial spacer 283 may cover a portion of the first sacrificial spacer layer 281. The top surface of the second sacrificial spacer 283 may be positioned at a lower level than the top surface of the bit line hard mask 24. When the second sacrificial spacer layer 282 is etched, the first sacrificial spacer layer 281 may not be etched. According to another embodiment of the present invention, when the second sacrificial spacer layer 282 is etched, the first sacrificial spacer layer 281 may be etched slowly.

The difference between the etch rate of the first sacrificial spacer layer 281 and the etch rate of the second sacrificial spacer layer 282 as described above may be obtained based on the etch selectivity difference between the first sacrificial spacer layer 281 and the second sacrificial spacer layer 282.

The first sacrificial spacer layer 281 and the second sacrificial spacer 283 may sequentially cover the first spacer layer 26A on both sidewalls of the bit line 23 and the bit line hard mask 24. After the second sacrificial spacer 283 is formed, a portion of the dielectric plug 27 may be exposed again.

As described above, the stack of the first sacrificial spacer layer 281 and the second sacrificial spacer 283 may be referred to as 'a non-conformal sacrificial spacer', and it may correspond to the non-conformal sacrificial spacer layer 28' of FIG. 8F.

Referring to FIG. 11C, a second spacer layer 31A may be formed. The second spacer layer 31A may be the same as the second spacer layer 31A of FIG. 8G.

Subsequently, the storage node contact plug 37 may be formed by a series of the processes illustrated in FIGS. 9A to 9I.

Subsequently, the capping layer 39 and the conductive pad 41 may be formed by a series of the processes illustrated in FIGS. 10A to 10E.

As described above, the method of fabricating a semiconductor device includes forming the bit line structure including the bit line 23 and the bit line hard mask 24 over the substrate 11, forming the first sacrificial spacer layer 281 on both sidewalls of the bit line structure, forming the second sacrificial spacer layer 282 which is thicker than the first sacrificial spacer layer 281 over the first sacrificial spacer layer 281, etching the second sacrificial spacer layer 282 to form the second sacrificial spacer 283 that is recessed lower than the top surface of the bit line structure, forming the storage node contact plug 37 that is positioned adjacent to the bit line structure with the first sacrificial spacer layer 282 and the second sacrificial spacer 283 therebetween, forming the air gap 38 by removing the first sacrificial spacer layer 281 and the second sacrificial spacer 283, forming the capping layer 39 that covers the storage node contact plug 37 and the air gap 38, forming the opening 40 that exposes the top surface of the storage node contact plug 37 by etching the capping layer 39, and forming the conductive pad 41 that is coupled to the storage node contact plug 37 in the opening 40.

The air gap 38 may include the upper air gap 38U which is positioned on the sidewall of the bit line hard mask 24 and the lower air gap 38L which is positioned on the sidewall of the bit line 23. The upper air gap 38U may be a narrow air gap having a narrower width than that of the lower air gap 38L, and the upper air gap 38U may be a wide air gap having a wider width than that of the lower air gap 38L. The capping layer 39 may include an extension portion 39' blocking the entrance of the upper air gap 38IU. The air gap 38 may be formed on both sidewalls of the bit line structure so as to form a pair of the air gap 38, and the pair of the air gaps 38 may have a symmetrical shape.

Figure 12:
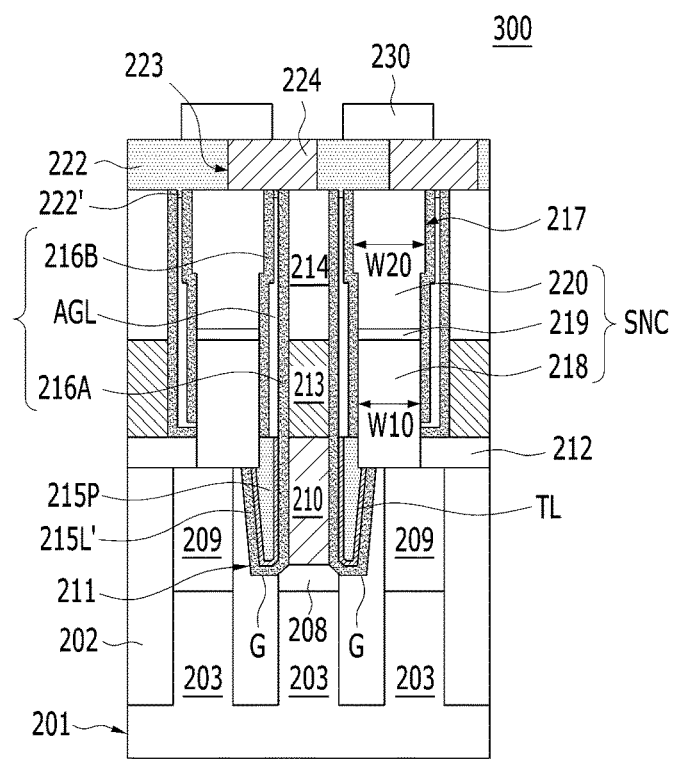
FIG. 12 is a cross-sectional view illustrating a memory cell 300 in accordance with yet another embodiment of the present invention.

FIG. 12 is a cross-sectional view illustrating a memory cell 300 in accordance with yet another embodiment of the present invention. The memory cell 300 may be similar to the memory cell 200 illustrated in FIGS. 5 to 6E.

Referring to FIG. 12, the memory cell 300 may include an air gap AGL formed between the bit line 213 and the storage node contact plug SNC. The air gap AGL may correspond to the air gap AGL illustrated in FIGS. 5 to 6E. Thus, the air gap AGL may include an upper air gap AGL-T and a lower air gap AGL-L (see FIGS. 6C to 6E). The upper air gap AGL-T may be a narrow air gap, and the lower air gap AGL-L may be a wide air gap which is wider than the upper air gap.

The memory cell 300 may further include a thin liner TL. The thin liner TL may be positioned on the sidewall of the bit line contact plug 210. The thin liner TL may be formed between the thick liner 215L' and the dielectric plug 215P. The thin liner TL may be thinner than the thick liner 215L'. The thin liner TL and the upper air gap AGL-T may have the same line width. The thin liner TL may be formed of or include a silicon oxide. The thick liner 215L' and the dielectric plug 215P may be formed of or include a silicon nitride. The thick liner 215L' may correspond to the liner 215L of FIG. 6A.

FIGS. 13A to 13J are cross-sectional views illustrating a method for forming the memory cell 300 in accordance with another embodiment of the present invention. Other constituent elements, except for the non-conformal sacrificial spacer layer, may be similar to those of FIGS. 7A to 10E.

First, the bit line structure including the bit line contact plug 22 and the bit line 23 may be formed through a series of the processes illustrated in FIGS. 7A to 7E.

Figure 13A:
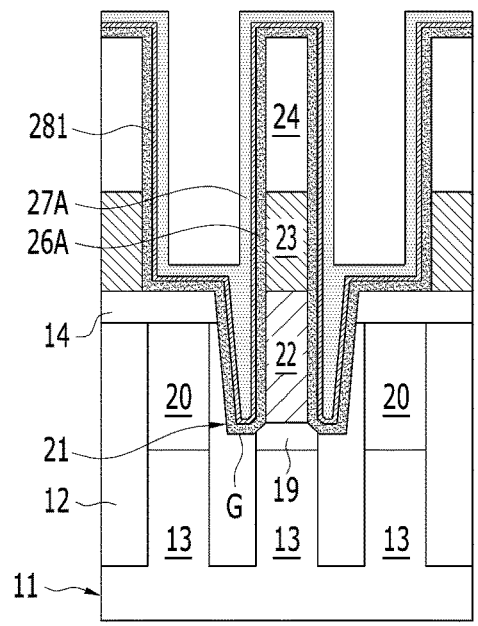
FIGS. 13A to 13J are cross-sectional views illustrating a method for forming the memory cell 300 in accordance with another embodiment of the present invention.

Subsequently, referring to FIG. 13A, the first spacer layer 26A may be formed. The first spacer layer 26A may cover the bit line structure and the hard mask layer 14. The first spacer layer 26A may cover both sidewalls of the bit line contact plug 22 and both sidewalls of the bit line 23. The first spacer layer 26A may cover the top surface of the bit line hard mask 24. The first spacer layer 26A may cover the surface of the gap G. The first spacer layer 26A may be formed conformally. The first spacer layer 26A may be formed of or include a silicon nitride.

The first sacrificial spacer layer 281 may be formed over the first spacer layer 26A. The first sacrificial spacer layer 281 may be formed of a sacrificial material. The first sacrificial spacer layer 281 may be formed of a material which is different from those of the first spacer layer 26A and the dielectric plug 27. The first sacrificial spacer layer 281 may include an oxide-based material. The first sacrificial spacer layer 281 may be formed of or include a silicon oxide. The first sacrificial spacer layer 281 may be thinner than the first spacer layer 26A. The first sacrificial spacer layer 281 may be conformally formed. The first sacrificial spacer layer 281 may be deposited by a Chemical Vapor Deposition (CVD) process, Atomic Layer Deposition (ALD) process, or the like. The thickness of the first sacrificial spacer layer 281 may be approximately 10 Å or less.

The plug spacer layer 27A may be formed over the first sacrificial spacer layer 281. The plug spacer layer 27A may be formed or include a dielectric material. The plug spacer layer 27A may be a non-oxide based material. The plug spacer layer 27A may be a nitride-based material. The plug spacer layer 27A may be formed of or include a silicon nitride. The plug spacer layer 27A and the first spacer layer 26A may be formed of the same material.

The plug spacer layer 27A may be formed non-conformally. The plug spacer layer 27A may completely fill the gap G over the first spacer layer 26A. The plug spacer layer 27A may cover the surface of the first spacer layer 26A.

Figure 13B:
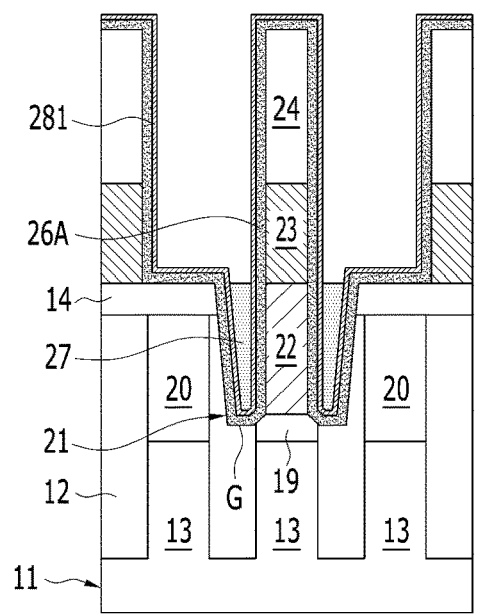

Referring to FIG. 13B, the dielectric plug 27 may be formed. The dielectric plug 27 may be formed by recessing the plug spacer layer 27A. An etch-back process may be performed to recess the plug spacer layer 27A. A pair of dielectric plugs 27 may be formed on both sidewalls of the bit line contact plugs 22. The first spacer layer 26A and the first sacrificial spacer layer 281 may be positioned between the dielectric plug 27 and the bit line contact plug 22. The top surface of the dielectric plug 27 may be controlled lower than the top surface of the bit line structure. For example, the dielectric plug 27 may not be adjacent to the sidewalls of the bit line 23. The top surface of the dielectric plug 27 may be positioned at a lower level than the bottom surface of the bit line 23. The plug spacer layer 27A may be removed from the top surface of the hard mask layer 14. The bottom surface of the dielectric plug 27 may be positioned at a lower level than the top surface of the active area 13.

The dielectric plug 27 may have a form of a pillar that fills the gap G. A pair of dielectric plugs 27 may be positioned in the inside of the first contact hole 21. The dielectric plug 27 may protect the gap G from being filling with an arbitrary material in the subsequent process. Also, the open area between the bit line structures may be widened by removing the plug spacer layer 27A on the sidewall of the bit line 23.

As described above, the bit line contact plug 22, the first spacer layer 26A, and a pair of dielectric plugs 27 may fill the first contact hole 21. Most dielectric plugs 27 may be positioned adjacent to both sidewalls of the bit line contact plugs 22. When the first spacer layer 26A and the dielectric plug 27 include a silicon nitride and the first sacrificial spacer layer 281 includes a silicon oxide, a dielectric structure of a NON (Nitride/Oxide/Nitride) stack may be formed on both sidewalls of the bit line contact plug 22. The first spacer layer 26A and the first sacrificial spacer layer 281 may extend to be positioned on both sidewalls of the bit line contact plug 22 while being formed on both sidewalls of the bit line 23.

Figure 13C:
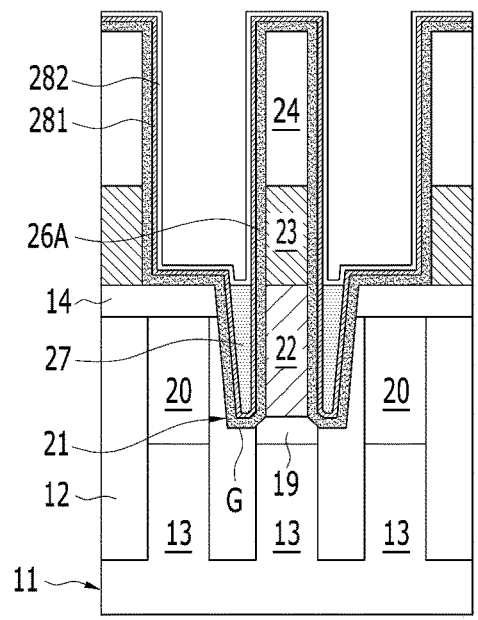

Referring to FIG. 13C, the second sacrificial spacer layer 282 may be formed over the dielectric plug 27 and the first sacrificial spacer layer 281. The second sacrificial spacer layer 282 may be as thick as the first sacrificial spacer layer 281. The second sacrificial spacer layer 282 may be thicker than the first sacrificial spacer layer 281. The second sacrificial spacer layer 282 may have an etch selectivity with respect to the first sacrificial spacer layer 281. The second sacrificial spacer layer 282 may be formed of a material which is different from the first spacer layer 26A and the dielectric plug 27. The second sacrificial spacer layer 282 may include an oxide-based material. The first sacrificial spacer layer 281 and the second sacrificial spacer layer 282 may be formed of different oxides. The second sacrificial spacer layer 282 may be conformally formed. The second sacrificial spacer layer 282 may be deposited by a Chemical Vapor Deposition (CVD) process, an Atomic Layer Deposition (ALD), or the like.

The first sacrificial spacer layer 281 and the second sacrificial spacer layer 282 may be formed of or include a silicon oxide, but they may have different etch selectivities. For example, the second sacrificial spacer layer 282 may have a faster etch rate than the first sacrificial spacer layer 281. Herein, the fast etch rate may be obtained under the same dry etch conditions. One between the first sacrificial spacer layer 281 and the second sacrificial spacer layer 282 may be SRO (Silicon-rich $SiO_2$), and the other may be $SiO_2$. The SRO (Silicon-rich $SiO_2$) may have a slower etching rate than $SiO_2$. One between the first sacrificial spacer layer 281 and the second sacrificial spacer layer 282 may be doped $SiO_2$, and the other may be undoped $SiO_2$. Herein, the dopant may include fluorine, boron, phosphorus, carbon, and the like. The doped $SiO_2$ and the undoped $SiO_2$ may have different etch rates. The doped $SiO_2$ may have a faster etch rate than the undoped $SiO_2$. According to another embodiment of the present invention, the first sacrificial spacer layer 281 and the second sacrificial spacer layer 282 may include the same silicon oxide, but they may be etched by using different etch gases. Accordingly, the first sacrificial spacer layer 281 and the second sacrificial spacer layer 282 may have an etch selectivity.

Figure 13D:
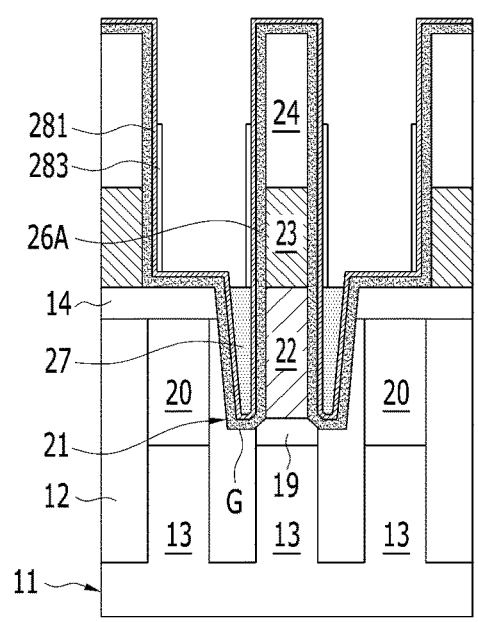

Referring to FIG. 13D, the second sacrificial spacer 283 may be formed. The second sacrificial spacer 283 may be formed by etching a portion of the second sacrificial spacer layer 282. The etch process of the second sacrificial spacer layer 282 may include a dry etch process. The etch process of the second sacrificial spacer layer 282 may include an etch-back process. The second sacrificial spacer 283 may cover a portion of the first sacrificial spacer layer 281. The top surface of the second sacrificial spacer 283 may be positioned at a lower level than the top surface of the bit line hard mask 24. When the second sacrificial spacer layer 282 is etched, the first sacrificial spacer layer 281 may not be etched. According to another embodiment of the present invention, when the second sacrificial spacer layer 282 is etched, the first sacrificial spacer layer 281 may be etched slowly.

The difference between the etch rate of the first sacrificial spacer layer 281 and the etch rate of the second sacrificial spacer layer 282 described above may be obtained based on the etch selectivity difference between the first sacrificial spacer layer 281 and the second sacrificial spacer layer 282.

The first sacrificial spacer layer 281 and the second sacrificial spacer 283 may sequentially cover the first spacer layer 26A on both sidewalls of the bit line 23 and the bit line hard mask 24. After the second sacrificial spacer 283 is formed, a portion of the dielectric plug 27 may be exposed again.

As described above, the stack of the first sacrificial spacer layer 281 and the second sacrificial spacer 283 may be referred to as 'a non-conformal sacrificial spacer', and the stack of the first sacrificial spacer layer 281 and the second sacrificial spacer 283 may correspond to the non-conformal sacrificial spacer layer 28'.

Figure 13E:
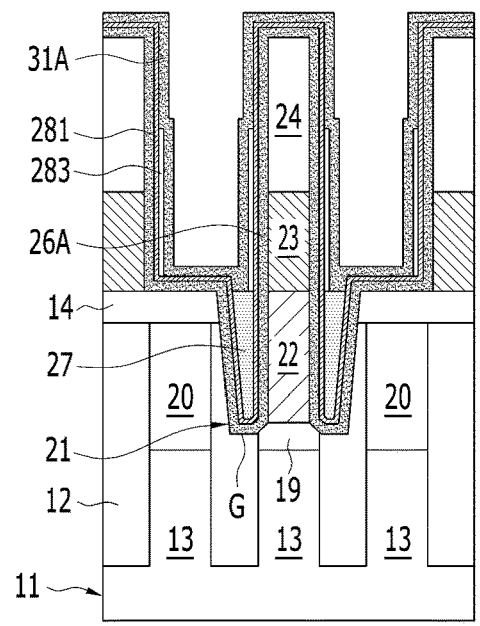

Referring to FIG. 13E, the second spacer layer 31A may be formed. The second spacer layer 31A may be the same as the second spacer layer 31A of FIG. 8G.

Subsequently, the storage node contact plug 37 may be formed through a series of the processes illustrated in FIGS. 9A to 9I.

Figure 13F:
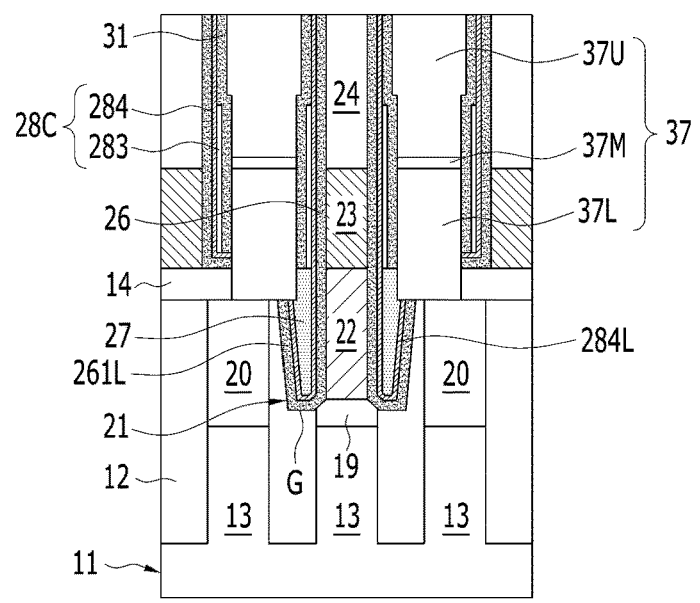

Referring to FIG. 13F, the storage node contact plug 37 may be formed by sequentially stacking the lower plug 37L, the ohmic contact layer 37M, and the upper plug 37U.

The first spacer 26, the first sacrificial spacer 284, the second sacrificial spacer 283 and the second spacer 31 may be positioned between the bit line 23 and the lower plug 37L. The first sacrificial spacer 284 may be formed by etching the first sacrificial spacer layer (refer to '281' of FIG. 12E). The stack of the first sacrificial spacer 284 and the second sacrificial spacer 283 may be referred to as the non-conformal sacrificial spacers 28C. On the sidewall of the bit line 23, a double sacrificial spacer of the first sacrificial spacer 284 and the second sacrificial spacer 283 may be formed. A single sacrificial spacer of the first sacrificial spacer 284 may be formed on the sidewall of the bit line hard mask 24. The single sacrificial spacer may be referred to as a thin sacrificial spacer, and the double sacrificial spacer may be referred to as a thick sacrificial spacer. The upper portion of the double sacrificial spacer may extend to be positioned on the sidewalls of the lower portion of the bit line hard mask 24.

The lower portion 284L of the first sacrificial spacer 284 may remain in the first contact hole 21 to be in contact with the dielectric plug 27. The lower portion 284L of the first sacrificial spacer 284 may be referred to as a thin liner 284L. The thin liner 284L may be positioned between the dielectric plug 27 and the thick liner 261L. The thicker liner 261L may be thicker than the thinner liner 284L. The thick liner 261L may correspond to the lower portion of the first spacer 26. The thick liner 261L may correspond to the liner 26L of FIG. 9I. The thick liner 26L, the thin liner 284L, and the dielectric plug 27 may be formed on both sidewalls of the bit line contact plug 22. The thick liner 26L, the thin liner 284L, and the dielectric plug 27 may be positioned in the inside of the first contact hole 21.

The non-conformal spacers 28C may have an elongated, straight linear shape which is in parallel to both sidewalls of the bit line structure.

As described above, after the storage node contact plug 37 isolation process is performed, an air gap may be formed.

Figure 13G:
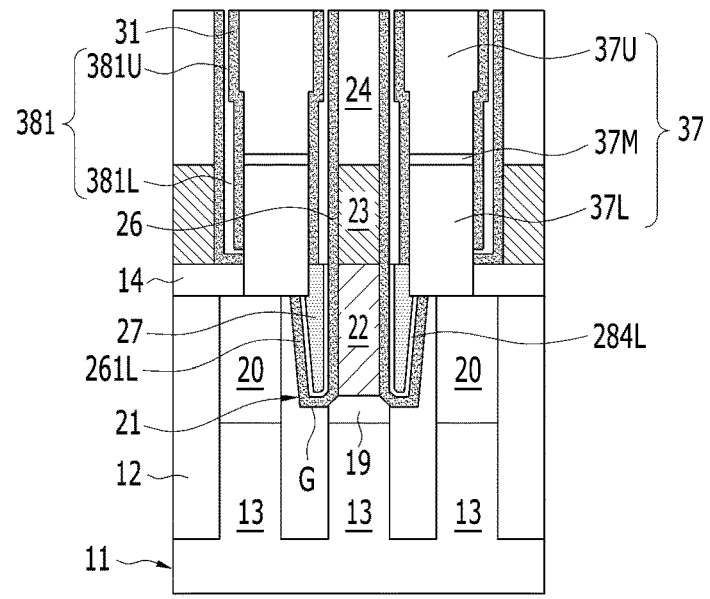

Referring to FIG. 13G, the first sacrificial spacer 284 and the second sacrificial spacer 283 may be removed so as to form an air gap 381. The first sacrificial spacer 284 and the second sacrificial spacer 283 may be removed by a wet etch process. For example, the wet etch process may use hydrofluoric acid (HF). All of the second sacrificial spacer 283 may be removed. The first sacrificial spacer 284 may be removed while leaving the thin liner 284L. Thus, the air gap 381 may be formed on both sidewalls of the bit line 23 and the bit line hard mask 24. The air gap 381 may correspond to the air gap 38 of FIG. 10A. The air gap 381 may include the lower air gap 381L and the upper air gap 381U. The upper air gap 381U may be a narrow air gap, and the lower air gap 381L may be a wide air gap. The upper air gap 381U may be positioned adjacent to both sidewalls of the bit line hard mask 24. The lower air gap 381L may be positioned adjacent to both sidewalls of the bit line 23. According to another embodiment of the present invention, the bottom portion of the upper air gap 381U may extend to be adjacent to the sidewall of the upper portion of the bit line 23.

A pair of the air gaps 381 may be symmetrical with the same height. The air gap 381 may have an elongated, straight linear shape which is in parallel to both sidewalls of the bit line 23. The air gaps 381 may be formed between the bit line 23 and the storage node contact plug 37.

Figure 13H:
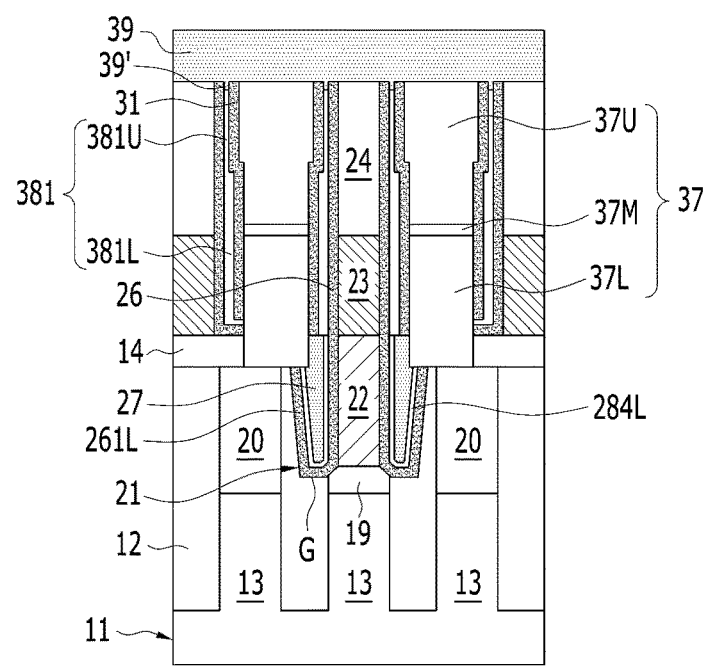

Referring to FIG. 13H, the capping layer 39 may be formed. The capping layer 39 may cover the storage node contact plug 37 and the air gap 381. A portion of the capping layer 39 may cap the upper portion of the air gap 381. For example, the entrance of the upper air gap 381U may be capped by the extension portion 39' of the capping layer 39. The capping layer 39 may be formed or include a dielectric material. The capping layer 39 may be formed of or include a silicon nitride. The capping layer 39 may be formed or include a material with poor step coverage. For example, the capping layer 39 may be formed by using a Plasma Enhanced Chemical Vapor Deposition (PECVD) process. The capping layer 39 may increase the structural stability of the air gap 381.

Since the upper air gap 381U has a narrow width, the capping layer 39 may fill only the entrance of the upper air gap 381U, while the other portion of the upper air gap 381U and the lower air gap 381L remain un-filled. As a result, the height of the air gap 381 may be sufficiently secured. Therefore, the effect of reducing the parasitic capacitance may be increased. Also, since the lower structure before the capping layer 39 is formed is flat, the capping layer 39 may be formed uniformly. As a result, the capping uniformity of the upper air gap 381U may be ensured. Therefore, a pair of the air gaps 381 may be formed symmetrically on both sidewalls of the bit line 23.

A multi-layer spacer including the air gap 381 may be formed on both sidewalls of the bit line 23. The multi-layer spacer may include the first spacer 26, the air gap 381 and the second spacer 31. Since the first and second spacers 26 and 31 include a silicon nitride, a multi-layer spacer of 'N-Air-N' structure may be formed.

Figure 13I:
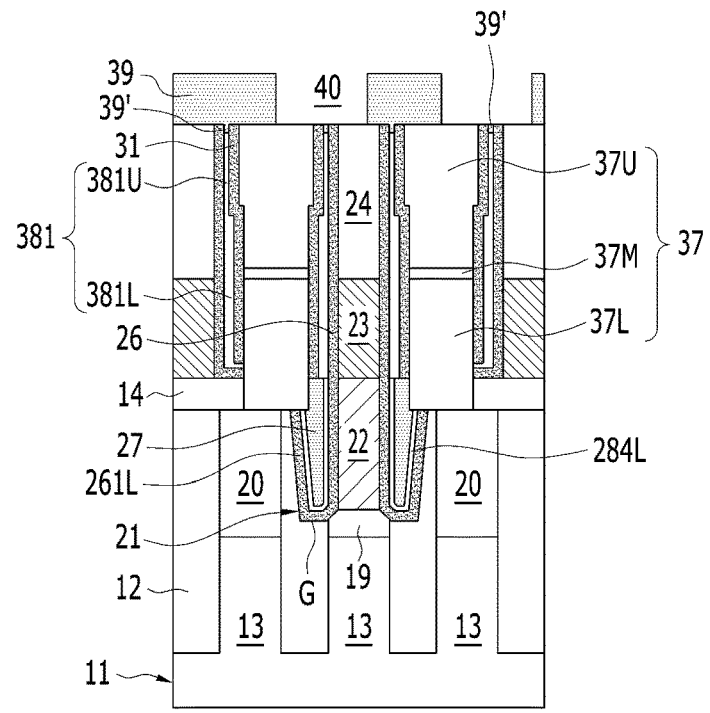

Referring to FIG. 13I, the opening 40 may be formed. The opening 40A may be formed by etching a portion of the capping layer 39. The opening 40 may expose a portion of the top surface of the storage node contact plug 37. For example, the upper plug 37U may be exposed by the opening 40. When the opening 40 is formed, the air gap 381 may not be exposed. This is because the extension portion 39' of the capping layer 39 protects the upper air gap 381U. Also, when the opening 40 is formed, there may be no loss of the upper plug 37U and the bit line hard mask 24. Even through the extension portion 39' of the capping layer 39 is formed, the symmetry of a pair of the air gaps 381 may be maintained.

Figure 13J:
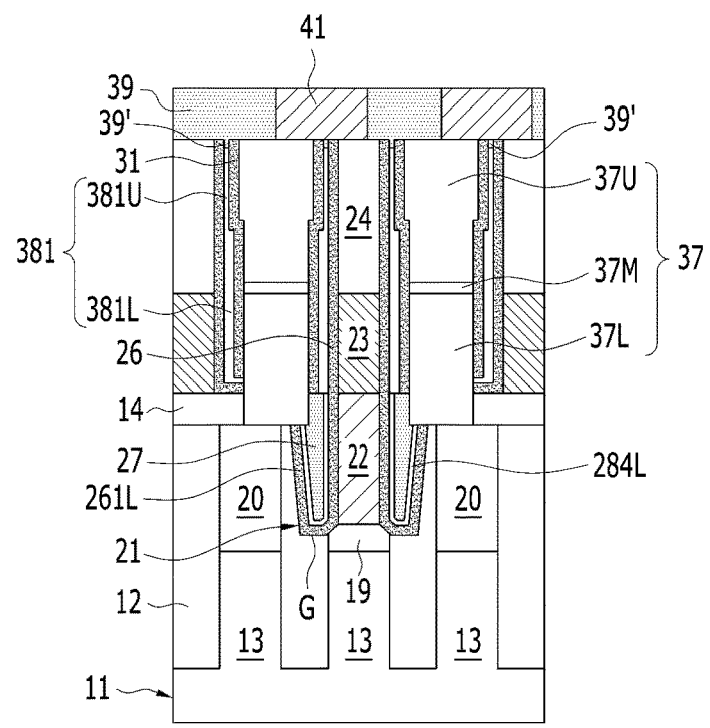

Referring to FIG. 13J, the conductive pad 41 may be formed. The conductive pad 41 may fill the opening 40. The conductive pad 41 may be formed by depositing a conductive material to fill the opening 40 and performing a planarization process. The conductive pad 41 may be formed of or include a metal material. The conductive pad 41 may include tungsten. The conductive pad 41 may be electrically connected to the storage node contact plug 37. The conductive pad 41 may be electrically connected to the upper plug 37U of the storage node contact plug 37. The conductive pad 41 and the upper plug 37U may partially overlap with each other. The conductive pad 41 and the bit line hard mask 24 may partially overlap with each other. As the conductive pad 41 is formed, the overlay margin with the subsequent capacitor 42 may be improved.

The air gap 381 may be capped with the capping layer 39, and not capped by the conductive pad 41.

Subsequently, referring to FIG. 10E, the capacitor 42 may be formed over the conductive pad 41.

As described above, the method of fabricating a semiconductor device in accordance with another embodiment of the present invention may include forming the bit line contact plug 22 over the substrate 11, forming the bit line structure which includes the bit line 23 and the bit line hard mask 24 over the bit line contact plug 22, forming the first sacrificial spacer layer 281 on both sidewalls of the bit line contact plug 22 and the bit line structure, forming the dielectric plug 27 which is adjacent to the sidewall of the bit line contact plug 22 over the first sacrificial spacer layer 281, forming the second sacrificial spacer layer 282 which is thicker than the first sacrificial spacer layer 281 over the dielectric plug 27 and the first sacrificial spacer layer 281, etching the second sacrificial spacer layer 282 to form the second sacrificial spacer 283 that is recessed lower than the top surface of the bit line structure, forming the storage node contact plug 37 which is adjacent to the bit line structure with the first sacrificial spacer layer 281 and the second sacrificial spacer 283 therebetween, forming the air gap 381 by removing the first sacrificial spacer layer 281 and the second sacrificial spacer 283, forming the capping layer 39 that covers the storage node contact plug 37 and the air gap 381, forming the opening 40 that exposes the top surface of the storage node contact plug 37 by etching the capping layer 39, and forming the conductive pad 41 which is coupled to the storage node contact plug 37 in the opening 40. The air gap 381 may include the upper air gap 381U which is positioned on the sidewall of the bit line hard mask 24 and the lower air gap 381L which is positioned on the sidewall of the bit line 23. The upper air gap 381U may be a narrow air gap having a narrower width than that of the lower air gap 381L, and the upper air gap 381U may be a wide air gap having a wider width than that of the lower air gap 381L. The capping layer 39 may include the extension portion 39' that blocks the entrance of the upper air gap 381U. The air gap 381 may be formed on both sidewalls of the bit line structure to form a pair, and the pair of the air gaps 381 may have a symmetrical shape.

According to an embodiment of the present invention, the parasitic capacitance may be reduced by forming an air gap between a bit line and a storage node contact plug.

According to an embodiment of the present invention, since an air gap is formed after a storage node contact plug process, the cleaning time for forming the air gap may be reduced.

According to an embodiment of the present invention, since a conductive pad is formed by using a Chemical Mechanical Polishing (CMP) process in an opening of a capping layer, a bridge between the conductive pads may be suppressed from being formed.

According to an embodiment of the present invention, since a side thickness of an upper plug is increased, the structural stability of a storage node contact plug may be increased.

While the present invention has been described with respect to the specific embodiments, it will be apparent to those skilled in the art that various changes and modifications may be made without departing from the spirit and scope of the invention as defined in the following claims.

What is claimed is:
1. A semiconductor device, comprising:
a plurality of bit line structures formed to be spaced apart from each other over a semiconductor substrate;
a bit line spacer formed on both sidewalls of each of the bit line structures;
a plurality of storage node contact plugs that are formed between the bit line structures and contact the semiconductor substrate;
a pair of line-shaped air gaps that is formed between the bit line structures and the storage node contact plugs and parallel to both sidewalls of the bit line structure;
a capping layer that caps the line-shaped air gaps and expose the top surfaces of the storage node contact plugs; and
a conductive pad coupled to the storage node contact plugs, wherein the pair of the line-shaped air gaps includes a lower air gap that is adjacent a sidewall of a lower portion of each of the bit line structures and an upper air gap that is adjacent to a sidewall of an upper portion of each of the bit line structures, and the upper air gap has a narrower width than the lower air gap, and wherein the capping layer include extension portions for partially filling an upper portion of each of the upper air gaps.

2. The semiconductor device of claim 1, further comprising:
a first spacer and a second spacer that are in parallel to the sidewalls of the bit line structures with the line-shaped air gaps therebetween.

3. The semiconductor device of claim 1, wherein the pair of the line-shaped air gaps has a symmetric shape on both sidewalls of each of the bit line structures.

4. The semiconductor device of claim 1, wherein each of the bit line structures includes:
a bit line contact plug over the semiconductor substrate;
a bit line over the bit line contact plug; and
a bit line hard mask over the bit line,
wherein the lower air gap is positioned on both sidewalls of the bit line, and the upper air gap is positioned on both sidewalls of the bit line hard mask.

5. The semiconductor device of claim 4, further comprising:
a contact hole in which the bit line contact plug is formed; and
a dielectric plug that fills the contact hole on both sidewalls of the bit line contact plug.

6. The semiconductor device of claim 1, wherein the storage node contact plug includes:
a lower plug;
an ohmic contact layer over the lower plug; and
an upper plug over the ohmic contact layer,
wherein a top surface of the upper plug is positioned at the same level as a top surface of the bit line structure.

7. The semiconductor device of claim 1, wherein the extension portion of the capping layer has a shape parallel to the sidewalls of the bit line structure.

8. The semiconductor device of claim 1, wherein the capping layer includes silicon nitride.

9. The semiconductor device of claim 1, wherein the capping layer further includes an opening expose a portion of the extension portions and the top surfaces of the storage node contact plugs.

10. The semiconductor device of claim 9, wherein the conductive pad filled in the opening of the capping layer, and an upper surface of the conductive pad and an upper surface of the capping layer are at a same level.

* * * * *